(12) United States Patent
Ha et al.

(10) Patent No.: US 10,405,437 B2
(45) Date of Patent: Sep. 3, 2019

(54) DISPLAY DEVICE

(71) Applicant: Samsung Display Co., Ltd., Yongin-si (KR)

(72) Inventors: Seung-Hwa Ha, Hwaseong-si (KR); Jeong Do Yang, Yongin-si (KR); Jung Yun Jo, Namyangju-si (KR); Jeong Ho Hwang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/676,332

(22) Filed: Aug. 14, 2017

(65) Prior Publication Data

US 2018/0063970 A1 Mar. 1, 2018

(30) Foreign Application Priority Data

Aug. 30, 2016 (KR) ........................ 10-2016-0110812

(51) Int. Cl.
*H05K 1/11* (2006.01)
*H05K 5/00* (2006.01)
(Continued)

(52) U.S. Cl.
CPC ....... *H05K 5/0017* (2013.01); *G01R 31/2818* (2013.01); *G02F 1/13452* (2013.01);
(Continued)

(58) Field of Classification Search
CPC ........ H05K 1/114; H05K 1/189; H05K 1/028; H05K 1/11; H05K 2201/053; H05K 2201/09709; H05K 5/0017; H05K 1/0268; H05K 1/111; H05K 1/181; G02F 1/13452; G02F 1/13458; G01R 31/2818
(Continued)

(56) References Cited

U.S. PATENT DOCUMENTS

2007/0285903 A1 12/2007 Tomari
2013/0082984 A1* 4/2013 Drzaic .................... G09G 3/20
                                                             345/204
(Continued)

FOREIGN PATENT DOCUMENTS

| JP | 2007-317861 | 12/2007 |
| JP | 2016-018207 | 2/2016 |
| KR | 10-2008-0085443 | 9/2008 |

*Primary Examiner* — Steven T Sawyer
(74) *Attorney, Agent, or Firm* — H.C. Park & Associates, PLC

(57) ABSTRACT

A display device includes a display substrate and a printed circuit board (PCB). The display substrate includes a display area to display an image, and includes a pad area outside the display area. The PCB is bonded to a surface of the display substrate in the pad area. The PCB includes a base film, first terminal wires positioned at the base film, second terminal wires positioned at the base film, first sub-pad terminals electrically connected to the first terminal wires through contact holes formed in the base film, and second sub-pad terminals directly and electrically connected to the second terminal wires without contact holes. The first sub-pad terminals and the second sub-pad terminals are alternately arranged. The first terminal wires and the second terminal wires are, in a view normal to the surface, spaced apart from one another.

20 Claims, 11 Drawing Sheets

(51) Int. Cl.
   *G01R 31/28*    (2006.01)
   *H05K 1/18*     (2006.01)
   *G02F 1/1345*   (2006.01)
   *H05K 1/02*     (2006.01)
   *G02F 1/13*     (2006.01)
   *H05K 3/36*     (2006.01)

(52) U.S. Cl.
   CPC ....... *G02F 1/13458* (2013.01); *H05K 1/0268* (2013.01); *H05K 1/11* (2013.01); *H05K 1/111* (2013.01); *H05K 1/181* (2013.01); *G02F 1/1309* (2013.01); *H05K 1/118* (2013.01); *H05K 3/361* (2013.01); *H05K 2201/09481* (2013.01); *H05K 2201/09709* (2013.01); *H05K 2201/10128* (2013.01); *H05K 2201/10954* (2013.01)

(58) Field of Classification Search
   USPC .......................... 361/749; 174/255, 254, 260
   See application file for complete search history.

(56) References Cited

U.S. PATENT DOCUMENTS

| | | | |
|---|---|---|---|
| 2014/0071646 A1* | 3/2014 | Qian | H05K 1/0219 |
| | | | 361/777 |
| 2014/0327148 A1* | 11/2014 | Lim | H01L 23/00 |
| | | | 257/774 |
| 2016/0011487 A1 | 1/2016 | Sugiyama | |
| 2016/0204534 A1* | 7/2016 | Ishida | H01R 12/88 |
| | | | 439/61 |

* cited by examiner

DISPLAY DEVICE

CROSS-REFERENCE TO RELATED APPLICATION

This application claims priority from and the benefit of Korean Patent Application No. 10-2016-0110812, filed Aug. 30, 2016, which is hereby incorporated by reference for all purposes as if fully set forth herein.

BACKGROUND

Field

Exemplary embodiments relate to a display device including a printed circuit board.

Discussion

Display devices, such as liquid crystal displays, plasma display panels, organic light-emitting diode displays, field effect displays, electrophoretic displays, and the like, are ubiquitous. Among display devices, organic light-emitting diode displays typically include an organic emission layer disposed between two electrodes. An electron injected from a first electrode of the two electrodes and a hole injected from a second electrode of the two electrodes are recombined in the organic emission layer to form an exciton. Radiative decay of the exciton is accompanied by photon emission that produces light. Since an organic light-emitting diode display can be self-luminous, a separate light source is not required, unlike in liquid crystal displays. As such, thickness and weight of an organic light-emitting diode display may be reduced. Further, organic light-emitting diode displays enable relatively low power consumption, high luminance, and rapid response speed.

A printed circuit board (PCB) may be bonded to a peripheral area of a display substrate of an organic light-emitting diode display. A signal to drive the organic light-emitting diode display may be transmitted to the display substrate through the PCB. To transmit the signal through the PCB, a pad terminal of the PCB and a pad terminal of the display substrate should not only be aligned and bonded, but differences in bonding characteristics should be reduced or eliminated, such as differences in area, thickness, and resistance of bonding portions that may otherwise vary depending on the position of the pad terminals.

The above information disclosed in this section is only for enhancement of an understanding of the background of the inventive concepts, and, therefore, it may contain information that does not form prior art already known to a person of ordinary skill in the art.

SUMMARY

One or more exemplary embodiments provide a display device capable of enabling performance of a test of a PCB via direct contact of a probe to a pad terminal of the PCB.

One or more exemplary embodiments provide a display device that is capable of minimizing or reducing differences in bonding characteristics depending on positions of pad terminals of a PCB when bonding the PCB to a display substrate of the display device.

Additional aspects will be set forth in the detailed description which follows, and, in part, will be apparent from the disclosure, or may be learned by practice of the inventive concepts.

According to one or more exemplary embodiments, display device includes a display substrate and a printed circuit board (PCB). The display substrate includes a display area to display an image, and includes a pad area outside the display area. The PCB is bonded to a surface of the display substrate in the pad area. The PCB includes a base film, first terminal wires positioned at the base film, second terminal wires positioned at the base film, first sub-pad terminals electrically connected to the first terminal wires through contact holes formed in the base film, and second sub-pad terminals directly and electrically connected to the second terminal wires without contact holes. The first sub-pad terminals and the second sub-pad terminals are alternately arranged. The first terminal wires and the second terminal wires are, in a view normal to the surface, spaced apart from one another.

According to one or more exemplary embodiments, a display device includes a display substrate and a printed circuit board (PCB). The display substrate includes a display area to display an image, and includes a pad area outside the display area. The PCB is bonded to a surface of the display substrate in the pad area. The PCB includes a base film, first terminal wires positioned at the base film, second terminal wires positioned at the base film, first sub-pad terminals electrically connected to the first terminal wires through contact holes formed in the base film, and second sub-pad terminals directly and electrically connected to the second terminal wires without contact holes. First ones of the first sub-pad terminals and the second sub-pad terminals are alternately arranged along a first column extending in a direction. Second ones of the first sub-pad terminals and the second sub-pad terminals are alternately arranged along a second column extending in the direction.

According to one or more exemplary embodiments, a test of a printed circuit board (PCB) may be performed by directly contacting a probe to a pad terminal of the PCB without a separate test terminal. Also, differences in bonding characteristics caused, at least in part, by the non-uniformity of a press force depending on positions of sub-pad terminals may be minimized or reduced when bonding the display substrate and the PCB.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
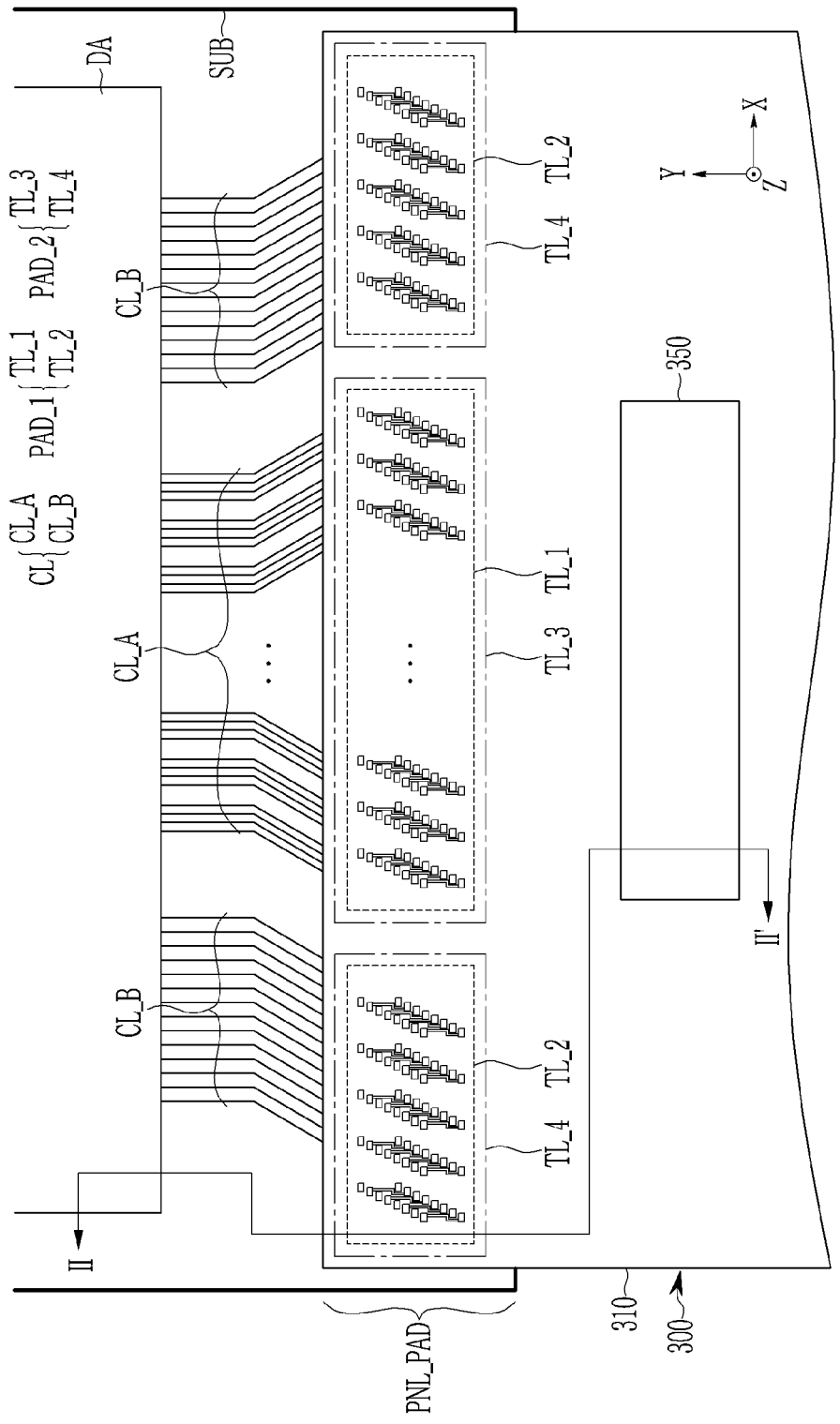
FIG. 1 is a schematic plan view of a display device including a printed circuit board according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

For the purposes of this specification, the phrase "in a plan view" refers to a view of an object when then object portion is viewed from above, and the phrase "in a cross-sectional view" refers to a view (or partial view) of an object when a cross-section of the object is taken by vertically cutting the object and the object is viewed from a side. Further, for the purposes of this specification, the phrase "overlapping" means to be vertically overlapping in a cross-sectional view, or positioning all or a part in the same region on a plane. For the purposes of this disclosure, and with reference to the drawings, an X-axis represents a first direction X, a Y-axis represents a second direction Y, and a Z-axis represents a third direction Z.

Figure 2:
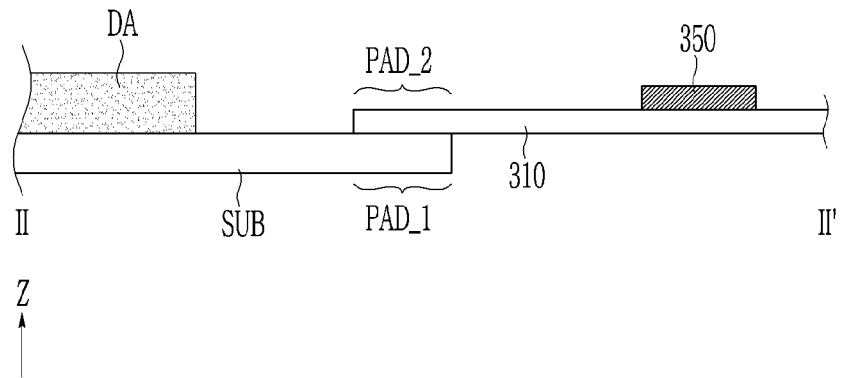
FIG. 2 is a cross-sectional view of the display device of FIG. 1 taken along sectional line II-II' according to one or more exemplary embodiments.

FIG. 1 is a schematic plan view of a display device including a printed circuit board according to one or more exemplary embodiments. FIG. 2 is a cross-sectional view of the display device of FIG. 1 taken along sectional line II-II' according to one or more exemplary embodiments.

Referring to FIGS. 1 and 2, a display device includes a display substrate SUB and a printed circuit board (PCB) 300. The display substrate SUB may include a display area DA displaying an image and a pad area PNL_PAD positioned near, e.g., outside, the display area DA. The display area DA and the pad area PNL_PAD are represented as an area positioned on the display substrate SUB.

Although not illustrated, the display area DA includes a plurality of pixels, and a plurality of data wires (or transmission lines), a plurality of gate wires, and a plurality of power source wires that are connected to the plurality of pixels. The plurality of pixels included in the display area DA may have various structures. For example, when the display device is a liquid crystal display, each of the plurality of pixels may include at least one thin film transistor, a pixel electrode connected to the at least one thin film transistor, a common electrode facing the pixel electrode, and a liquid crystal layer and a color filter that are positioned between the pixel electrode and the common electrode. When the display device is an organic light-emitting diode display, each of the plurality of pixels may include at least one thin film transistor, an anode connected to the at least one thin film transistor, a cathode corresponding to the anode, and an organic emission layer positioned between the anode and the cathode.

The kind of the display device and the structure of the display area DA may be variously changed. In other words, the kind of the display device and the structure of the display area DA is not limited to or by any particular kind and/or structure.

The pad area PNL_PAD is an area positioned outside (e.g., around) the display area DA. The PCB 300 transmitting a signal to drive the display device is bonded to the display substrate SUB in the pad area PNL_PAD. That is, in the pad area PNL_PAD, the display substrate SUB and the PCB 300 may be overlapped with each other. The pad area PNL_PAD of the display substrate SUB includes a first pad portion PAD_1. The first pad portion PAD_1 may be electrically bonded to the PCB 300.

In one or more exemplary embodiments, the first pad portion PAD_1 may include a first terminal region TL_1 and a second terminal region TL_2. The first terminal region TL_1 and the second terminal region TL_2 represent areas positioned on the display substrate SUB. The first terminal region TL_1 may be connected to the data wires (not shown) of the display area DA through first connection wires CL_A. The second terminal region TL_2 may be connected to the gate wire (not shown), the power source wire (not illustrated), and/or the like of the display area DA through second connection wires CL_B. Each of the first terminal region TL_1 and the second terminal region TL_2 may include a plurality of first pad terminals PAD_TL_A (referring to FIG. 3) as will become more apparent below.

The first terminal region TL_1 and the second terminal region TL_2 may be arranged in the first direction X, e.g., spaced apart from one another in the first direction X. In this case, the pad area PNL_PAD may be positioned to be separated from the display area DA in the second direction Y.

As shown in FIG. 1, the second terminal region TL_2 may be respectively positioned at sides (e.g., both lateral sides) of the first terminal region TL_1. However, exemplary embodiments are not limited thereto or thereby. For instance, the second terminal region TL_2 may be positioned between a pair of first terminal regions TL_1. Also, one second terminal region TL_2 may be positioned at one side of the first terminal region TL_1.

Connection wires CL are positioned between the display area DA and the pad area PNL_PAD. The display area DA and the pad area PNL_PAD may be connected to each other through the connection wires CL. The connection wires CL may connect the plurality of signal wires (the data wire, the gate wire, the power source wire, and the like) positioned in the display area DA and the first pad terminals PAD_TL_A positioned in the pad area PNL_PAD.

The connection wires CL may include first connection wires CL_A and second connection wires CL_B. The first connection wires CL_A may connect the display area DA and the first terminal region TL_1 to each other, and the second connection wires CL_B may connect the display area DA and the second terminal region TL_2 to each other.

The PCB 300 includes a base film 310, a driving chip 350, and a second pad portion PAD_2. The PCB 300 is bonded to the first pad portion PAD_1 of the pad area PNL_PAD of the display substrate SUB, thereby enabling a signal to drive the plurality of pixels included in the display area DA to be transmitted to the display area DA via the PCB 300. The driving chip 350 may be positioned on the base film 310 of the PCB 300 to generate the signal for driving the plurality of pixels (not shown).

The second pad portion PAD_2 may be positioned at (or near) one end of the base film 310, and the second pad portion PAD_2 may be electrically bonded to the first pad portion PAD_1 of the display substrate SUB. The second pad portion PAD_2 may be disposed to face the first pad portion PAD_1.

The second pad portion PAD_2 may include a third terminal region TL_3 and a fourth terminal region TL_4. The third terminal region TL_3 and the fourth terminal region TL_4 represent regions positioned on the base film 310. Each of the third terminal region TL_3 and the fourth terminal region TL_4 may include a plurality of second pad terminals PAD_TL_B (referring to FIG. 5) as will become more apparent below. The plurality of second pad terminals PAD_TL_B may be arranged in a pattern corresponding to the plurality of first pad terminals PAD_TL_A. For instance, the second pad portion PAD_2 of the PCB 300 may have a shape corresponding to that of the first pad portion PAD_1 of the display substrate SUB. The plurality of second pad terminals PAD_TL_B positioned at the second pad portion PAD_2 may be arranged with the same pattern as the plurality of first pad terminals PAD_TL_A positioned at the first pad portion PAD_1.

The plurality of first pad terminals PAD_TL_A included in the first pad portion PAD_1 of the display substrate SUB will be described with reference to FIG. 3. The plurality of first pad terminals PAD_TL_A included in the first terminal region TL_1 will be described as an example.

Figure 3:
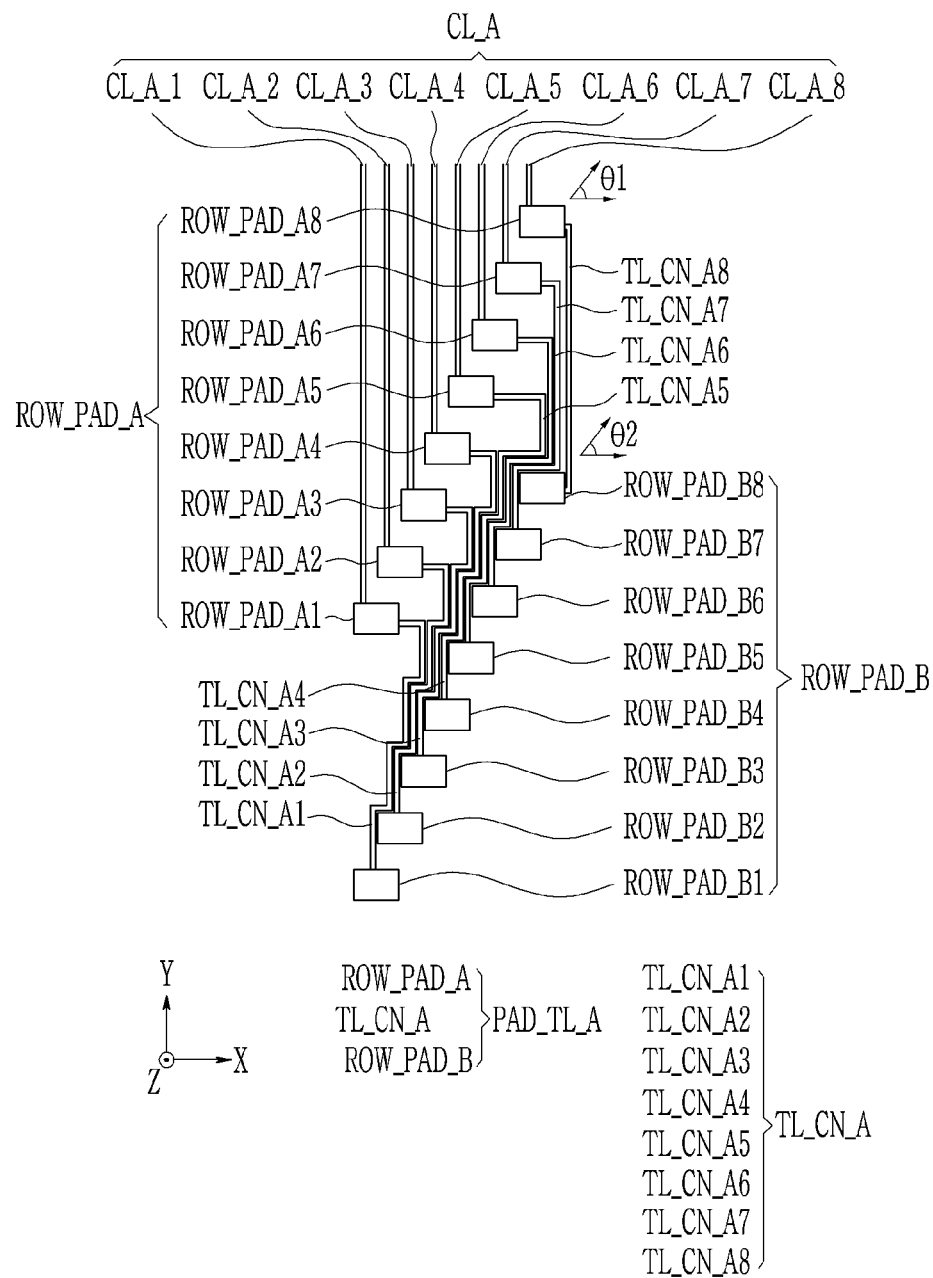
FIG. 3 is an enlarged view of a first terminal region of the display device of FIG. 1 according to one or more exemplary embodiments.

FIG. 3 is an enlarged view of a first terminal region of the display device of FIG. 1 according to one or more exemplary embodiments.

Referring to FIG. 3, a plurality of first pad terminals PAD_TL_A may be disposed in the first terminal region TL_1. The plurality of first pad terminals PAD_TL_A may be disposed to be separated from each other by a determined interval in the first direction X in the first terminal region TL_1. Each of the plurality of first pad terminals PAD_TL_A may include first column sub-pad terminals ROW_PAD_A, second column sub-pad terminals ROW_PAD_B, and first terminal connection lines TL_CN_A.

The first column sub-pad terminals ROW_PAD_A may be arranged to be separated from each other in one direction. In this case, the first column sub-pad terminals ROW_PAD_A may be arranged with a first inclination angle $\theta 1$ with the first direction X. That is, the first column sub-pad terminals ROW_PAD_A may be arranged to be inclined with respect to the first direction X by the first inclination angle $\theta 1$. The first inclination angle $\theta 1$ may be greater than 0 degrees and may be less than 90 degrees.

Intervals of adjacent first column sub-pad terminals ROW_PAD_A may be equal to each other. For example, the interval between the first-first column sub-pad terminal ROW_PAD_A1 and the second-first column sub-pad terminal ROW_PAD_A2 may be equal to the interval between the second-first column sub-pad terminal ROW_PAD_A2 and the third-first column sub-pad terminal ROW_PAD_A3.

Each of the first column sub-pad terminals ROW_PAD_A may be made with an approximate quadrangle shape. For example, each of the first column sub-pad terminals ROW_PAD_A may be made with the quadrangle shape approximately having a length of 70 μm and a width of 70 μm. Also, the interval between adjacent first column sub-pad terminals ROW_PAD_A may be about 20 μm in the second direction Y. It is contemplated, however, that any other suitable shape for the first column sub-pad terminals ROW_PAD_A may be utilized in association with exemplary embodiments.

The second column sub-pad terminals ROW_PAD_B may be positioned to be separated from the first column sub-pad terminals ROW_PAD_A in the second direction Y. Like the first column sub-pad terminals ROW_PAD_A, the second column sub-pad terminals ROW_PAD_B may be arranged to be separated from each other in one direction. In this case, the second column sub-pad terminals ROW_PAD_B may be arranged with a second inclination angle $\theta 2$ with the first direction X. That is, the second column sub-pad terminals ROW_PAD_B may be inclined with respect to the first direction X by the second inclination angle $\theta 2$. The second inclination angle $\theta 2$ may be greater than 0 degrees and less than 90 degrees.

The first inclination angle $\theta 1$ and the second inclination angle $\theta 2$ may be equal to each other. That is, the first column sub-pad terminals ROW_PAD_A and the second column sub-pad terminals ROW_PAD_B may all be arranged to be inclined with the same angle with the first direction X. However, exemplary embodiments are not limited thereto or thereby. For instance, the first inclination angle $\theta 1$ and the second inclination angle $\theta 2$ may be different from each other. That is, the first column sub-pad terminals ROW_PAD_A and the second column sub-pad terminals ROW_PAD_B may be arranged to be inclined with respect to different angles with the first direction X.

Intervals of adjacent second column sub-pad terminals ROW_PAD_B may be equal to each other. For example, the interval between the first-second column sub-pad terminal ROW_PAD_B1 and the second-second column sub-pad terminal ROW_PAD_B2 may be equal to the interval between the second-second column sub-pad terminal ROW_PAD_B2 and the third-second column sub-pad terminal ROW_PAD_B3.

Each of the second column sub-pad terminals ROW_PAD_B may be made with an approximate quadrangle shape. For example, each of the second column sub-pad terminals ROW_PAD_B may be made with the quadrangle shape approximately having a length of 70 μm and a width of 70 μm. Also, the interval between adjacent second column sub-pad terminals ROW_PAD_B may be about 20 μm in the second direction Y. It is contemplated, however, that any other suitable shape for the second column sub-pad terminals ROW_PAD_B may be utilized in association with exemplary embodiments.

The plurality of first column sub-pad terminals ROW_PAD_A and the plurality of second column sub-pad terminals ROW_PAD_B may be connected to each other by the plurality of first terminal connection lines TL_CN_A. That is, each of the plurality of first terminal connection lines TL_CN_A may connect one among the plurality of first column sub-pad terminals ROW_PAD_A and one among the plurality of second column sub-pad terminals ROW_PAD_B to each other.

For example, the first-first column sub-pad terminal ROW_PAD_A1 and the first-second column sub-pad terminal ROW_PAD_B1 may be connected to each other by the first-first terminal connection line TL_CN_A1. The second-first column sub-pad terminal ROW_PAD_A2 and the second-second column sub-pad terminal ROW_PAD_B2 may be connected to each other by the second-first terminal connection line TL_CN_A2. The third-first column sub-pad terminal ROW_PAD_A3 and the third-second column sub-pad terminal ROW_PAD_B3 may be connected to each other by the third-first terminal connection line TL_CN_A3. The fourth-first column sub-pad terminal ROW_PAD_A4 and the fourth-second column sub-pad terminal ROW_PAD_B4 may be connected to each other by the fourth-first terminal connection line TL_CN_A4. The fifth-first column sub-pad terminal ROW_PAD_A5 and the fifth-second column sub-pad terminal ROW_PAD_B5 may be connected to each other by the fifth-first terminal connection line TL_CN_A5. The sixth-first column sub-pad terminal ROW_PAD_A6 and the sixth-second column sub-pad terminal ROW_PAD_B6 may be connected to each other by the sixth-first terminal connection line TL_CN_A6. The seventh-first column sub-pad terminal ROW_PAD_A7 and the seventh-second column sub-pad terminal ROW_PAD_B7 may be connected to each other by the seventh-first terminal connection line TL_CN_A7. The eighth-first column sub-pad terminal ROW_PAD_A8 and the eighth-second column sub-pad terminal ROW_PAD_B8 may be connected to each other by the eighth-first terminal connection line TL_CN_A8.

According to one or more exemplary embodiments, each of the plurality of first terminal connection lines TL_CN_A may have a shape that is bent at least one time. As shown in FIG. 3, the first terminal connection lines TL_CN_A may have a shape that extends along the periphery of the second column sub-pad terminals ROW_PAD_B positioned between the first column sub-pad terminals ROW_PAD_A and the second column sub-pad terminals ROW_PAD_B that are connected to each other.

For example, the first-first terminal connection line TL_CN_A1 extends from the first-second column sub-pad terminal ROW_PAD_B1 along the periphery of the second-second column sub-pad terminal ROW_PAD_B2 in the second direction Y and then is bent in the first direction X, then is bent along the periphery of the third-second column sub-pad terminal ROW_PAD_B3 in the second direction Y and then is bent in the first direction X, then is bent along the periphery of the fourth-second column sub-pad terminal ROW_PAD_B4 in the second direction Y and is bent in the first direction X, and then is bent along the periphery of the fifth-second column sub-pad terminal ROW_PAD_B5 in the second direction Y and is bent in the first direction X to be connected to the first-first column sub-pad terminal ROW_PAD_A1. The second-first to fourth-first terminal connection lines TL_CN_A2, TL_CN_A3, and TL_CN_A4 may also be bent and extended in a similar manner as the first-first terminal connection line TL_CN_A1.

The fifth-first terminal connection line TL_CN_A5 extends from the fifth second column sub-pad terminal ROW_PAD_B5 along the periphery of the sixth-second column sub-pad terminal ROW_PAD_B7 in the second direction Y and then is bent in the first direction X, then is bent along the periphery of the seventh-second column sub-pad terminal ROW_PAD_B7 in the second direction Y, then is bent in the first direction X, then is bent along the periphery of the eight-second column sub-pad terminal ROW_PAD_B8 in the second direction Y, then is bent in the first direction X, then is bent and extends in the second direction Y, and then is bent in the first direction X to be connected to the fifth-first column sub-pad terminal ROW_PAD_A5. The sixth-first terminal connection line TL_CN_A6 extends from the sixth second column sub-pad terminal ROW_PAD_B6 along the periphery of the seventh-second column sub-pad terminal ROW_PAD_B7 in the second direction Y and then is bent in the first direction X, then is bent along the periphery of the eighth-second column sub-pad terminal ROW_PAD_B8 in the second direction Y, then is bent in the first direction X, then is again bent and extends in the second direction Y, and then is bent in the first direction X to be connected to the sixth-first column sub-pad terminal ROW_PAD_A6. The seventh-first terminal connection line TL_CN_A7 extends from the seventh-second column sub-pad terminal ROW_PAD_B7 along the periphery of the eighth-second column sub-pad terminal ROW_PAD_B8 in the second direction Y, then is bent in the first direction X, then is bent and extends in the second direction Y, and then is bent in the first direction X to be connected to the seventh-first column sub-pad terminal ROW_PAD_A7. The eighth-first terminal connection wires TL_CN_A8 extends from the eighth-second column sub-pad terminal ROW_PAD_B8 in the first direction X, then is bent and extends in the second direction Y, and then is again bent and extends in the first direction X to be connected to the eighth-first column sub-pad terminal ROW_PAD_A8.

As described above, the first terminal connection lines TL_CN_A may have a shape that is bent two or more times. In this case, the plurality of first terminal connection lines TL_CN_A may be positioned at the same layer on the display substrate SUB. The plurality of first terminal connection lines TL_CN_A may be arranged in a shape such that they are not overlapped with each other.

The plurality of first column sub-pad terminals ROW_PAD_A may be connected to the first connection wires CL_A. For example, the first-first column sub-pad terminal ROW_PAD_A1 may be connected to the first-first connection wire CL_A_1. The second-first column sub-pad terminal ROW_PAD_A2 may be connected to the second-first connection wire CL_A_2. The third-first column sub-pad terminal ROW_PAD_A3 may be connected to the third-first connection wire CL_A_3. The fourth-first column sub-pad terminal ROW_PAD_A4 may be connected to the fourth-first connection wire CL_A_4. The fifth-first column sub-pad terminal ROW_PAD_A5 may be connected to the fifth-first connection wire CL_A_5. The sixth-first column sub-pad terminal ROW_PAD_A6 may be connected to the sixth-first connection wire CL_A_6. The seventh-first column sub-pad terminal ROW_PAD_A7 may be connected to the seventh-first connection wire CL_A_7. The eighth-first column sub-pad terminal ROW_PAD_A8 may be connected to the eighth-first connection wire CL_A_8.

The plurality of first connection wires CL_A may extend from the plurality of first column sub-pad terminals ROW_PAD_A in the second direction Y. That is, the plurality of first connection wires CL_A may extend from the plurality of first column sub-pad terminals ROW_PAD_A to the display area DA.

As described above, as the first column sub-pad terminals ROW_PAD_A and the second column sub-pad terminals ROW_PAD_B are arranged to be inclined with the predetermined angle with the first direction X. In this manner, many pad terminals may be positioned in the predetermined area, such as the first terminal region TL_1 of the pad area PNL_PAD.

The configuration of the plurality of first pad terminals PAD_TL_A included in the above-described first terminal region TL_1 may be applied to the plurality of first pad terminals PAD_TL_A included in the second terminal region TL_2. That is, the plurality of second pad terminals PAD_TL_B included in the second terminal region TL_2 may be configured in the same method as the plurality of first pad terminals PAD_TL_A included in the first terminal region TL_1.

Figure 5:
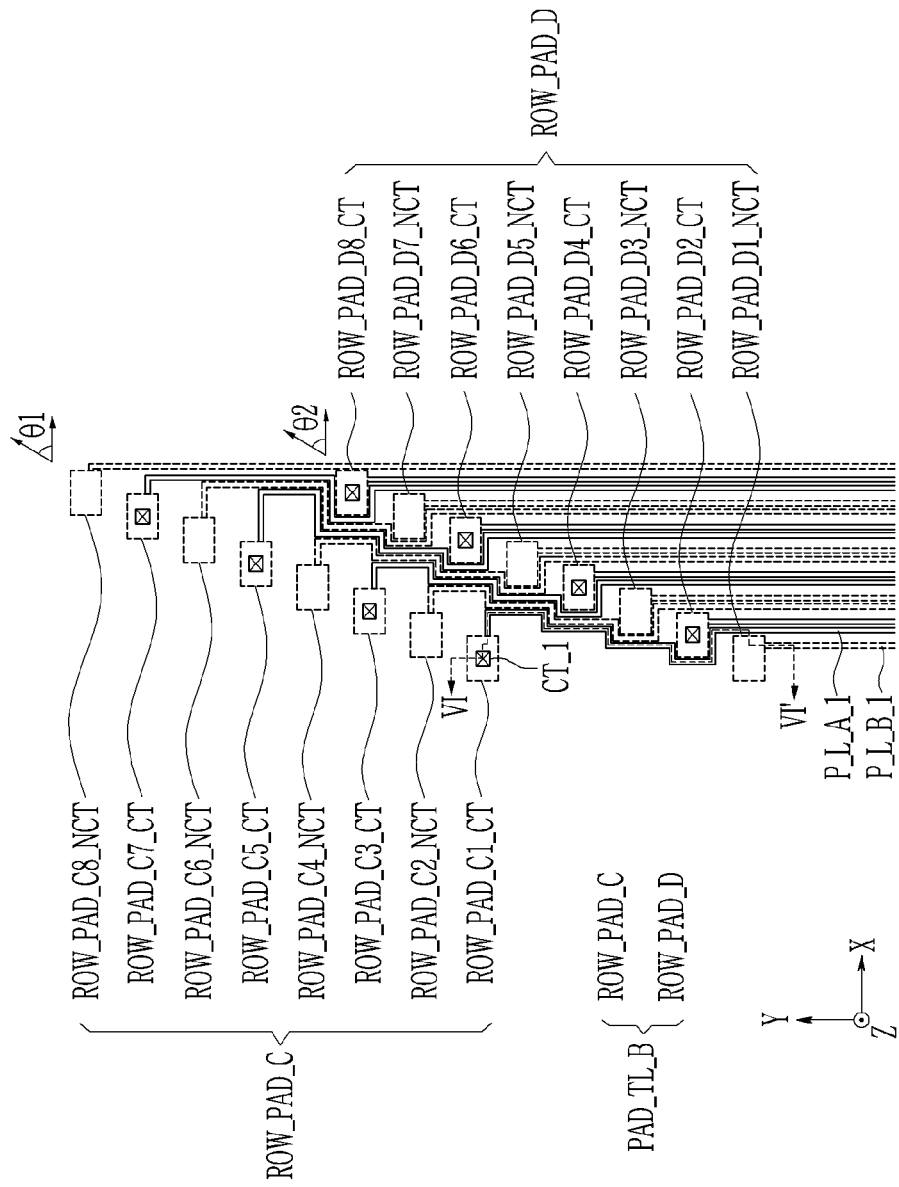
FIG. 5 is an enlarged view of second pad terminals of a region A of the printed circuit board of FIG. 4 according to one or more exemplary embodiments.
Figure 6:
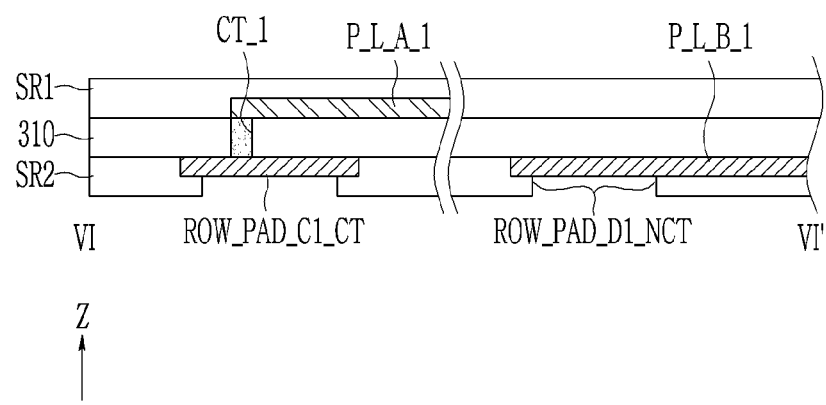
FIG. 6 is a cross-sectional view of the printed circuit board of FIG. 5 taken along sectional line VI-VI' according to one or more exemplary embodiments.

The PCB 300 will be described in more detail with reference to FIGS. 4 to 6. It is noted that FIGS. 5 and 6 show a plurality of second pad terminals PAD_TL_B included in the third terminal region TL_3 as an example.

Figure 4:
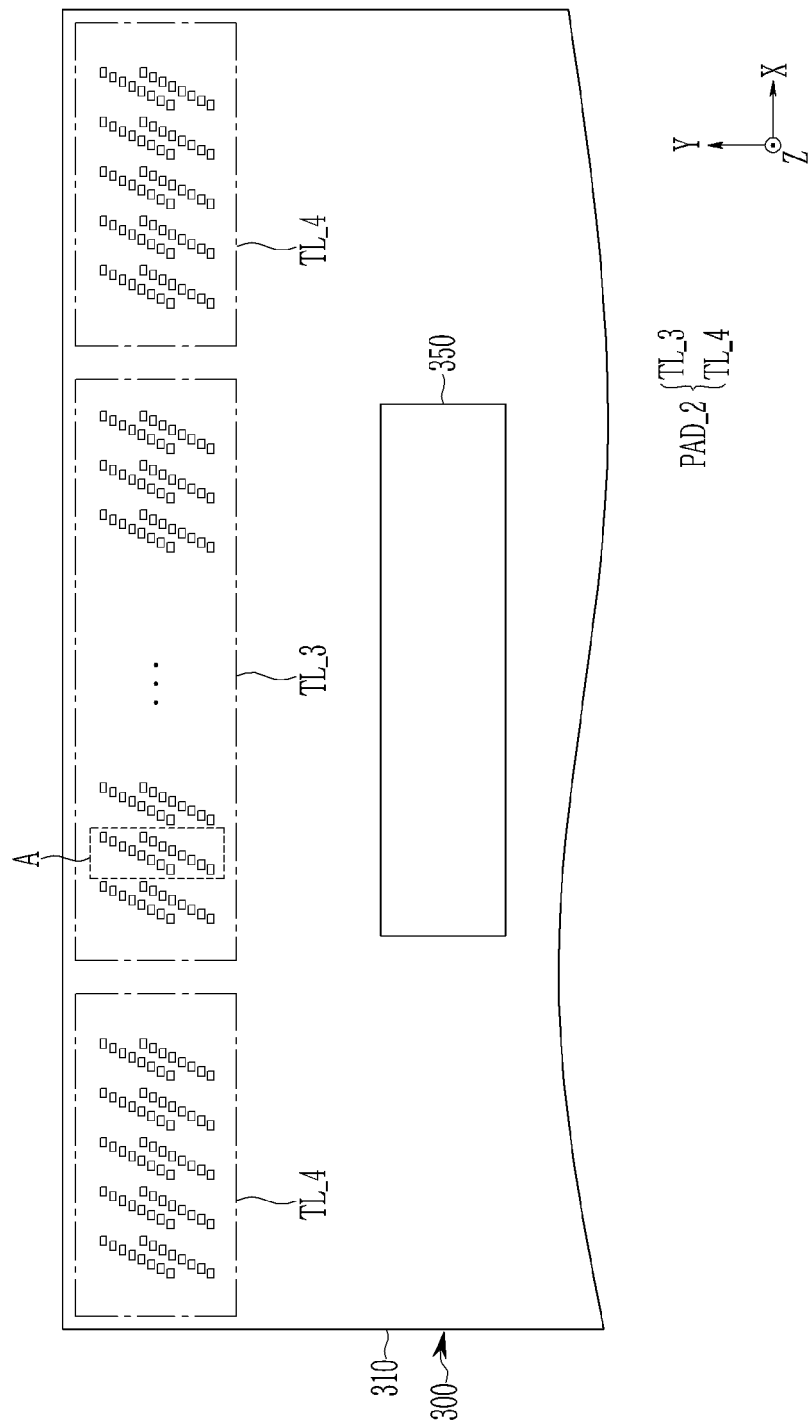
FIG. 4 is a schematic plan view of the printed circuit board of the display device of FIG. 1 according to one or more exemplary embodiments.

FIG. 4 is a schematic plan view of the printed circuit board of the display device of FIG. 1 according to one or more exemplary embodiments. FIG. 5 is an enlarged view of second pad terminals of a region A of the printed circuit board of FIG. 4 according to one or more exemplary embodiments. FIG. 6 is a cross-sectional view of the printed circuit board of FIG. 5 taken along sectional line VI-VI' according to one or more exemplary embodiments.

Referring to FIG. 4, the PCB 300 includes a base film 310, a second pad portion PAD_2, and a driving chip 350.

The second pad portion PAD_2 may be positioned at one end of the base film 310 that is flexible. The second pad portion PAD_2 may be made with a shape corresponding to the shape of the first pad portion PAD_1 of the above-described display substrate SUB. As the second pad portion PAD_2 of the PCB 300 and the first pad portion PAD_1 of the display substrate SUB are formed with shapes corresponding to each other, the first pad portion PAD_1 and the second pad portion PAD_2 may be easily bonded to each other.

The second pad portion PAD_2 may include a third terminal region TL_3 and a fourth terminal region TL_4. The third terminal region TL_3 and the fourth terminal region TL_4 represent regions positioned on the base film 310. The third terminal region TL_3 and the fourth terminal region TL_4 may be arranged (e.g., spaced apart from one another) in the first direction X on the base film 310.

As shown in FIG. 4, the fourth terminal region TL_4 may be respectively positioned at both sides of the third terminal region TL_3. However, exemplary embodiments are not limited thereto or thereby. For instance, the fourth terminal region TL_4 may be positioned between a pair of third terminal regions TL_3. Also, one fourth terminal region TL_4 may be positioned at one side of the third terminal region TL_3.

The arrangement of the third terminal region TL_3 and the fourth terminal region TL_4 may be determined according to the arrangement of the first terminal region TL_1 and the second terminal region TL_2 that are positioned in (or on) the display substrate SUB. For example, if the second terminal region TL_2 is respectively positioned at both sides of the first terminal region TL_1 in the display substrate SUB, the fourth terminal region TL_4 may be respectively positioned at both sides of the third terminal region TL_3 of the PCB 300. Also, if the second terminal region TL_2 is positioned between a pair of first terminal regions TL_1 in the display substrate SUB, the fourth terminal region TL_4 may be positioned between a pair of third terminal regions TL_3 in the PCB 300. Further, if one second terminal region TL_2 is positioned at one side of the first terminal region TL_1 in the display substrate SUB, then one fourth terminal region TL_4 may be positioned at one side of the third terminal region TL_3 in the PCB 300.

Referring to FIGS. 5 and 6, the third terminal region TL_3 is the region corresponding to the first terminal region TL_1 of the display substrate SUB, and a plurality of second pad terminals PAD_TL_B may be positioned at the third terminal region TL_3. In FIGS. 5 and 6, the plurality of second pad terminals PAD_TL_B positioned at the third terminal region TL_3 are described, however, the plurality of second pad terminals PAD_TL_B positioned at the fourth terminal region TL_4 may also be arranged in the same method as the plurality of second pad terminals PAD_TL_B of FIGS. 5 and 6.

The plurality of second pad terminals PAD_TL_B may be arranged in the same pattern as the first pad terminals PAD_TL_A arranged in the above-described first terminal region TL_1. Each of the plurality of second pad terminals PAD_TL_B may include third column sub-pad terminals ROW_PAD_C and fourth column sub-pad terminals ROW_PAD_D.

The third column sub-pad terminals ROW_PAD_C may be arranged to be separated from each other in one direction. In this case, the third column sub-pad terminals ROW_PAD_C may be inclined with the first inclination angle θ1 with respect to the first direction X. That is, the third column sub-pad terminals ROW_PAD_C may be arranged to be inclined with the same angle as the first column sub-pad terminals ROW_PAD_A of the display substrate SUB. The first inclination angle θ1 may be greater than 0 degrees and less than 90 degrees.

The intervals of adjacent third column sub-pad terminals ROW_PAD_C may be equal to each other. For example, the interval between the first-third column sub-pad terminal ROW_PAD_C1_CT and the second-third column sub-pad terminal ROW_PAD_C2_NCT may be equal to the interval between the second-third column sub-pad terminal ROW_PAD_C2_NCT and the third-third column sub-pad terminal ROW_PAD_C3_CT. In this case, the adjacent third column sub-pad terminals ROW_PAD_C may be arranged with the same interval as the above-described described first column sub-pad terminals ROW_PAD_A.

The third column sub-pad terminals ROW_PAD_C are formed in the region that is in electrical contact with the first column sub-pad terminals ROW_PAD_A of the display substrate SUB, and each of the third column sub-pad terminals ROW_PAD_C may be formed with the approximate quadrangle shape. For example, each of the third column sub-pad terminals ROW_PAD_C may be made with the quadrangle shape approximately having a length of 70 μm and a width of 70 μm. Intervals between adjacent third column sub-pad terminals ROW_PAD_C may be about 20 μm in the second direction Y. Exemplary embodiments, however, are not limited to or by the shape of or interval between third column sub-pad terminals ROW_PAD_C.

The fourth column sub-pad terminals ROW_PAD_D may be positioned to be separated from the third column sub-pad terminals ROW_PAD_C in the second direction Y. Like the third column sub-pad terminals ROW_PAD_C, the fourth column sub-pad terminals ROW_PAD_D may be arranged to be separated from each other in one direction. In this case, the fourth column sub-pad terminals ROW_PAD_D may be arranged with the second inclination angle θ2 in the first direction X. The fourth column sub-pad terminals ROW_PAD_D may be arranged to be inclined with the second inclination angle θ2 with the first direction X. That is, the fourth column sub-pad terminals ROW_PAD_D may be arranged to be inclined with the same angle as the second column sub-pad terminals ROW_PAD_B of the display substrate SUB. In this case, the second inclination angle θ2 may be greater than 0 degrees and may be less than 90 degrees.

In one or more exemplary embodiments, like the first column sub-pad terminals ROW_PAD_A and the second column sub-pad terminals ROW_PAD_B of the display substrate SUB, the first inclination angle θ1 and the second inclination angle θ2 may be equal to each other. Accordingly, the third column sub-pad terminals ROW_PAD_C and the fourth column sub-pad terminals ROW_PAD_D may be arranged to be inclined with the same angle with respect to the first direction X. Exemplary embodiments, however, are not limited thereto or thereby. For instance, the first inclination angle θ1 and the second inclination angle θ2 may be different from each other. Accordingly, the third column sub-pad terminals ROW_PAD_C and the fourth column sub-pad terminals ROW_PAD_D may be arranged to be inclined with different angles with respect to the first direction X.

Intervals between adjacent fourth column sub-pad terminals ROW_PAD_D may be equal to each other. For example, the interval between the first-fourth column sub-pad terminal ROW_PAD_D1_NCT and the second-fourth column sub-pad terminal ROW_PAD_D2_CT may be equal to the interval between the second-fourth column sub-pad terminal ROW_PAD_D2_CT and the third-fourth column sub-pad terminal ROW_PAD_D3_NCT.

The fourth column sub-pad terminals ROW_PAD_D are formed in the region that is electrically connected to the second column sub-pad terminals ROW_PAD_B of the display substrate SUB, and each of the fourth column sub-pad terminals ROW_PAD_D may be made of the approximate quadrangle shape. For example, each of the fourth column sub-pad terminals ROW_PAD_D may be made with the quadrangle shape approximately having the length of 70 µm and the width of 70 µm. Also, the interval between the adjacent fourth column sub-pad terminals ROW_PAD_D may be about 20 µm in the second direction Y. Exemplary embodiments, however, are not limited to or by the shape of or interval between fourth column sub-pad terminals ROW_PAD_D.

The plurality of first terminal wires P_L_A_1 may be positioned at a first surface of the base film 310, and a plurality of second terminal wires P_L_B_1 may be positioned at a second surface of the base film 310. The second surface of the base film 310 is a bottom surface of the base film 310 facing the display substrate SUB, and the first surface of the base film 310 is a top surface of the base film 310 opposite to the surface facing the display substrate SUB.

On the other hand, the base film 310 may be a multi-layered structure made of a plurality of layers. In this case, the first terminal wires P_L_A_1 may be positioned at any one layer of the base film 310, and the second terminal wires P_L_B_1 may be positioned at another layer of the base film 310. The first terminal wires P_L_A_1 and the second terminal wires P_L_B_1 may be positioned at different layers and may not overlap each other. In this case, one layer of the base film 310 in which the first terminal wires P_L_A_1 are positioned may be referred to as the first surface of the base film 310, and another layer of the base film 310 in which the second terminal wires P_L_B_1 are positioned may be referred to as the second surface of the base film 310.

The plurality of first terminal wires P_L_A_1 and the plurality of second terminal wires P_L_B_1 may be respectively and electrically connected to the driving chip 350. The plurality of first terminal wires P_L_A_1 and the plurality of second terminal wires P_L_B_1 may be arranged in the first direction X, and may approximately extend in the second direction Y from the driving chip 350. As seen in FIG. 4, the driving chip 350 may be disposed on the first surface of the base film 310.

A first protection layer SR1 may be positioned on the plurality of first terminal wires P_L_A_1, and a second protection layer SR2 may be positioned under the plurality of second terminal wires P_L_B_1. In this case, the first protection layer SR1 and the second protection layer SR2 may be formed of a solder-resist.

The third column sub-pad terminals ROW_PAD_C and the fourth column sub-pad terminals ROW_PAD_D may be positioned at the same layer as the second terminal wires P_L_B_1. The third column sub-pad terminals ROW_PAD_C and the fourth column sub-pad terminals ROW_PAD_D may be formed by removing a part of the second protection layer SR2 to expose a part of the second terminal wires P_L_B_1. In this case, the third column sub-pad terminals ROW_PAD_C and the fourth column sub-pad terminals ROW_PAD_D are separated from each other.

The part among the third column sub-pad terminals ROW_PAD_C and the part among the fourth column sub-pad terminals ROW_PAD_C may be electrically connected to the first terminal wires P_L_A_1 through a first contact hole CT_1 formed in the base film 310.

For example, as shown in FIG. 5, odd-numbered third column sub-pad terminals ROW_PAD_C1_CT, ROW_PAD_C3_CT, ROW_PAD_C5_CT, and ROW_PAD_C7_CT among the third column sub-pad terminals ROW_PAD_C and even-numbered fourth column sub-pad terminals ROW_PAD_D2_CT, ROW_PAD_D4_CT, ROW_PAD_D6_CT, and ROW_PAD_D8_CT among the fourth column sub-pad terminals ROW_PAD_D are electrically connected to the first terminal wires P_L_A_1 through the first contact hole CT_1, respectively. Also, even-numbered third column sub-pad terminals ROW_PAD_C2_NCT, ROW_PAD_C4_NCT, ROW_PAD_C6_NCT, and ROW_PAD_C8_NCT among the third column sub-pad terminals ROW_PAD_C and odd-numbered fourth column sub-pad terminals ROW_PAD_D1_NCT, ROW_PAD_D3_NCT, ROW_PAD_D5_NCT, and ROW_PAD_D7_NCT among the fourth column sub-pad terminals ROW_PAD_D may be directly and electrically connected to the second terminal wires P_L_B_1 without the first contact hole CT_1.

Hereinafter, the third column sub-pad terminals ROW_PAD_C1_CT, ROW_PAD_C3_CT, ROW_PAD_C5_CT, and ROW_PAD_C7_CT that are electrically connected to the first terminal wires P_L_A_1 through the first contact hole CT_1 are referred to as third column sub-pad terminals of a via structure, and the third column sub-pad terminals ROW_PAD_C2_NCT, ROW_PAD_C4_NCT, ROW_PAD_C6_NCT, and ROW_PAD_C8_NCT that are directly and electrically connected to the second terminal wires P_L_B_1 without the contact hole CT_1 are referred to as third column sub-pad terminals of a non-via structure. Also, the fourth column sub-pad terminals ROW_PAD_D2_CT, ROW_PAD_D4_CT, ROW_PAD_D6_CT, and ROW_PAD_D8_CT that are electrically connected to the first terminal wires P_L_A_1 through the first contact hole CT_1 are referred to as the fourth column sub-pad terminals of the via structure, and the fourth column sub-pad terminals ROW_PAD_D1_NCT, ROW_PAD_D3_NCT, ROW_PAD_D5_NCT, and ROW_PAD_D7_NCT that are directly and electrically connected to the second terminal wires P_L_B_1 without the first contact hole CT_1 are referred to as fourth column sub-pad terminals of the non-via structure.

As described above, the third column sub-pad terminals ROW_PAD_C1_CT, ROW_PAD_C3_CT, ROW_PAD_C5_CT, and ROW_PAD_C7_CT of the via structure and the third column sub-pad terminals ROW_PAD_C2_NCT, ROW_PAD_C4_NCT, ROW_PAD_C6_NCT, and ROW_PAD_C8_NCT of the non-via structure may be alternately arranged one-by-one along one column of one direction. Also, the fourth column sub-pad terminals ROW_PAD_D2_CT, ROW_PAD_D4_CT, ROW_PAD_D6_CT, and ROW_PAD_D8_CT of the via structure and the fourth column sub-pad terminals ROW_PAD_D1_NCT, ROW_PAD_D3_NCT, ROW_PAD_D5_NCT, and ROW_PAD_D7_NCT of the non-via structure may be alternately arranged one-by-one along another column of one direction. In this case, each of the fourth column sub-pad terminals ROW_PAD_D1_NCT, ROW_PAD_D3_NCT, ROW_PAD_D5_NCT, and ROW_PAD_D7_NCT of the non-via structure may be positioned from each of the third column sub-pad terminals ROW_PAD_C1_CT, ROW_PAD_C3_CT, ROW_PAD_C5_CT, and ROW_PAD_C7_CT of the via structure in the second direction Y, e.g., in a diagonal direction extending in the first direction X and the second direction Y. Also, each of the fourth column sub-pad terminals ROW_PAD_D2_CT, ROW_PAD_D4_CT, ROW_PAD_D6_CT, and ROW_PAD_D8_CT of the via structure may be positioned from each of the third column sub-pad terminals ROW_PAD_C2_NCT, ROW_PAD_C4_NCT, ROW_PAD_C6_NCT, and ROW_PAD_C8_NCT of the non-via structure in the second direction Y, e.g., in a diagonal direction extending in the first direction X and the second direction Y.

The plurality of first terminal wires P_L_A_1 and the plurality of second terminal wires P_L_B_1 are not overlapped with each other. The plurality of first terminal wires P_L_A_1 and the plurality of second terminal wires P_L_B_1 that are connected to the fourth column sub-pad terminals ROW_PAD_D have the shape that extends in the second direction Y without bending. The plurality of first terminal wires P_L_A_1 and the plurality of second terminal wires P_L_B_1 that are connected to the third column sub-pad terminals ROW_PAD_C may have the shape that is bent at least one time.

For example, the first terminal wire P_L_A_1 connected to the first-third column sub-pad terminal ROW_PAD_C1_CT extends in the second direction Y and then is bent in the first direction X between the first-fourth column sub-pad terminal ROW_PAD_D1_NCT and the second-fourth column sub-pad terminal ROW_PAD_D2_CT, then is bent in the second direction Y along the periphery of the second-fourth column sub-pad terminal ROW_PAD_D2_CT, and then is bent in step shapes along the peripheries of the second-fourth column sub-pad terminal ROW_PAD_D2_CT, the third-fourth column sub-pad terminal ROW_PAD_D3_NCT, and the fourth-fourth column sub-pad terminal ROW_PAD_D4_CT, then is bent in the second direction Y to extend along the fifth-fourth column sub-pad terminal ROW_PAD_D5_NCT, and then is bent in the first direction X to be connected to the first-third column sub-pad terminal ROW_PAD_C1_CT.

The second terminal wire P_L_B_1 connected to the second-third column sub-pad terminal ROW_PAD_C2_NCT extends in the second direction Y and then is bent between the second-fourth column sub-pad terminal ROW_PAD_D2_CT and the third-fourth column sub-pad terminal ROW_PAD_D3_NCT in the first direction X, is bent in the second direction Y along the periphery of the third-fourth column sub-pad terminal ROW_PAD_D3_NCT, and then is bent in first direction X along the periphery of the third-fourth column sub-pad terminal ROW_PAD_D3_NCT, then is bent in the second direction Y to extend along the periphery of the fourth-fourth column sub-pad terminal ROW_PAD_D4_CT, then is bent in the first direction X along the periphery of the fourth-fourth column sub-pad terminal ROW_PAD_D4_CT, then is bent in the second direction Y to extend along the periphery of the fifth-fourth column sub-pad terminal ROW_PAD_D5_NCT, then is bent in the second direction X to extend along the periphery of the fifth-fourth column sub-pad terminal ROW_PAD_D5_NCT, then is bent in the second direction Y to extend along the periphery of the sixth-fourth column sub-pad terminal ROW_PAD_D6_CT, and then is bent in the first direction X to be connected to the second-third column sub-pad terminal ROW_PAD_C2_NCT.

The first terminal wire P_L_A_1 connected to the third-third column sub-pad terminal ROW_PAD_C3_CT extends in the second direction Y, is bent between the third-fourth column sub-pad terminal ROW_PAD_D3_NCT and the fourth-fourth column sub-pad terminal ROW_PAD_D4_CT in the first direction X, is bent along the periphery of the fourth-fourth column sub-pad terminal ROW_PAD_D4_CT in the second direction Y, and then is bent in a step shape along the peripheries of the fourth-fourth column sub-pad terminal ROW_PAD_D4_CT, the fifth-fourth column sub-pad terminal ROW_PAD_D5_NCT, and the sixth-fourth column sub-pad terminal ROW_PAD_D6_CT, then is bent in the second direction Y to extend along the periphery of the seventh-fourth column sub-pad terminal ROW_PAD_D7_NCT, and then is bent in the first direction X to be connected to the third-third column sub-pad terminal ROW_PAD_C3_CT.

The second terminal wire P_L_B_1 connected to the fourth-third column sub-pad terminal ROW_PAD_C4_NCT extends in the second direction Y, is bent between the fourth-fourth column sub-pad terminal ROW_PAD_D4_CT and the fifth-fourth column sub-pad terminal ROW_PAD_D5_NCT in the first direction X, is bent along the periphery of the fifth-fourth column sub-pad terminal ROW_PAD_D5_NCT in the second direction Y, and is bent in a step shape along the peripheries of the fifth-fourth column sub-pad terminal ROW_PAD_D5_NCT, the sixth-fourth column sub-pad terminal ROW_PAD_D6_CT, and the seventh-fourth column sub-pad terminal ROW_PAD_D7_NCT, then is bent in the second direction Y along the periphery of the eight-fourth column sub-pad terminal ROW_PAD_D8_CT, and then is bent in the first direction X to be connected to the fourth-third column sub-pad terminal ROW_PAD_C4_NCT.

The first terminal wire P_L_A_1 connected to the fifth-third column sub-pad terminal ROW_PAD_C5_CT extends in the second direction Y, is bent between the fifth-fourth column sub-pad terminal ROW_PAD_D5_NCT and the sixth-fourth column sub-pad terminal ROW_PAD_D6_CT in the first direction X, is bent along the periphery of the sixth-fourth column sub-pad terminal ROW_PAD_D6_CT in the second direction Y, is bent in a step shape along the peripheries of the sixth-fourth column sub-pad terminal ROW_PAD_D6_CT, the seventh-fourth column sub-pad terminal ROW_PAD_D7_NCT, and the eighth-fourth column sub-pad terminal ROW_PAD_D8_CT, is bent in the second direction Y, and then is bent in the first direction X to be connected to the fifth-third column sub-pad terminal ROW_PAD_C5_CT.

The second terminal wire P_L_B_1 connected to the sixth-third column sub-pad terminal ROW_PAD_C6_NCT extends in the second direction Y, is bent between the sixth-fourth column sub-pad terminal ROW_PAD_D6_CT and the seventh-fourth column sub-pad terminal ROW_PAD_D7_NCT in the first direction X, is bent along the periphery of the seventh-fourth column sub-pad terminal ROW_PAD_D7_NCT in the second direction Y, is bent in a step shape along the peripheries of the seventh-fourth column sub-pad terminal ROW_PAD_D7_NCT and the eighth-fourth column sub-pad terminal ROW_PAD_D8_CT, is bent in the second direction Y, and then is bent in the first direction X to be connected to the sixth-third column sub-pad terminal ROW_PAD_C6_NCT.

The first terminal wire P_L_A_1 connected to the seventh-third column sub-pad terminal ROW_PAD_C7_CT extends in the second direction Y, is bent between the seventh-fourth column sub-pad terminal ROW_PAD_D7_NCT and the eighth-fourth column sub-pad terminal ROW_PAD_D8_CT in the first direction X, is bent along the periphery of the eighth-fourth column sub-pad terminal ROW_PAD_D8_CT in the second direction Y, is bent in a step shape along the periphery of the eighth-fourth column sub-pad terminal ROW_PAD_D8_CT, and is bent in the first direction X to be connected to the seventh-third column sub-pad terminal ROW_PAD_C7_CT.

The second terminal wire P_L_B_1 connected to the eighth-third column sub-pad terminal ROW_PAD_C8_NCT extends in the second direction Y to be adjacent to the eighth-fourth column sub-pad terminal ROW_PAD_D8_CT and is bent in the first direction X to be connected to the eighth-third column sub-pad terminal ROW_PAD_C8_NCT.

As described above, the plurality of first terminal wires P_L_A_1 and the plurality of second terminal wires P_L_B_1 do not overlap to each other when viewed in the third direction Z. In this manner, the plurality of first terminal wires P_L_A_1 and the plurality of second terminal wires P_L_B_1 that are connected to the third column sub-pad terminals ROW_PAD_C may be arranged to avoid the fourth column sub-pad terminals ROW_PAD_D.

As shown in FIG. 6, the first contact hole CT_1 may overlap the first-third column sub-pad terminal ROW_PAD_C1_CT of the via structure. In this case, the same metal as in the first terminal wire P_L_A_1 may be filled in the first contact hole CT_1. The metal configuring the first-third column sub-pad terminal ROW_PAD_C1_CT of the via structure may be different than the metal of the first terminal wire P_L_A_1 and the first contact hole CT_1. The first-fourth column sub-pad terminal ROW_PAD_D1_NCT of the non-via structure may be formed of the same metal as the second terminal wire P_L_B_1. The first-fourth column sub-pad terminal ROW_PAD_D1_NCT of the non-via structure may correspond to the region where the part of the second terminal wire P_L_B_1 is exposed. In other words, the second terminal wire P_L_B_1 may extend from the first-fourth column sub-pad terminal ROW_PAD_D1_NCT.

The cross-sectional structure of the second, fourth, sixth, and eighth-fourth column sub-pad terminals ROW_PAD_D2_CT, ROW_PAD_D4_CT, ROW_PAD_D6_CT, and ROW_PAD_D8_CT of the via structure is the same as the structure of the first-third column sub-pad terminal ROW_PAD_C1_CT of the via structure shown in FIG. 6. The cross-sectional structure of the second, fourth, sixth, and eighth-third column sub-pad terminals ROW_PAD_C2_NCT, ROW_PAD_C4_NCT, ROW_PAD_C6_NCT, and ROW_PAD_C8_NCT of the non-via structure is the same as the cross-sectional structure of the first-fourth column sub-pad terminal ROW_PAD_D1_NCT of the non-via structure shown in FIG. 6. As such, duplicative descriptions are omitted to avoid obscuring exemplary embodiments.

As described above, as the third column sub-pad terminals ROW_PAD_C1_CT, ROW_PAD_C3_CT, ROW_PAD_C5_CT, and ROW_PAD_C7_CT of the via structure and the third column sub-pad terminals ROW_PAD_C2_NCT, ROW_PAD_C4_NCT, ROW_PAD_C6_NCT, and ROW_PAD_C8_NCT of the non-via structure are alternately arranged one-by-one along one column of one direction, and the fourth column sub-pad terminals ROW_PAD_D2_CT, ROW_PAD_D4_CT, ROW_PAD_D6_CT, and ROW_PAD_D8_CT of the via structure and the fourth column sub-pad terminals ROW_PAD_D1_NCT, ROW_PAD_D3_NCT, ROW_PAD_D5_NCT, and ROW_PAD_D7_NCT of the non-via structure are alternately arranged one-by-one along another column of one direction, a difference generated in the bonding characteristics due to non-uniformity of a pressing force depending on a position of the sub-pad terminals when bonding the display substrate SUB and the PCB 300 together may be reduced.

When pressing the pad area PN_PAD to bond the display substrate SUB and the PCB 300, the third column sub-pad terminals ROW_PAD_C1_CT, ROW_PAD_C3_CT, ROW_PAD_C5_CT, and ROW_PAD_C7_CT of the via structure and the fourth column sub-pad terminals ROW_PAD_D2_CT, ROW_PAD_D4_CT, ROW_PAD_D6_CT, and ROW_PAD_D8_CT of the via structure may be suppressed from being excessively pressed by the metal filling the first contact hole CT_1. On the other hand, the third column sub-pad terminals ROW_PAD_C2_NCT, ROW_PAD_C4_NCT, ROW_PAD_C6_NCT, and ROW_PAD_C8_NCT of the non-via structure and the fourth column sub-pad terminals ROW_PAD_D1_NCT, ROW_PAD_D3_NCT, ROW_PAD_D5_NCT, and ROW_PAD_D7_NCT of the non-via structure are not supported by other metals, but are supported by the base film 310, and, therefore, are suppressed from being excessively pressed.

As described above, given that the sub-pad terminal of the via structure is positioned adjacent to the sub-pad terminal of the non-via structure, the sub-pad terminal of the via structure can suppress the sub-pad terminal of the non-via structure from being excessively pressed. Accordingly, the sub-pad terminals may be entirely and uniformly pressed, such that, in the pad area PNL_PAD, differences in the bonding characteristics of the sub-pad terminals may be minimized or at least reduced.

If the third column sub-pad terminals ROW_PAD_C were only made of the via structure and the fourth column sub-pad terminals ROW_PAD_D were only made of the non-via structure, then when pressing the pad area PNL_PAD to bond the display substrate SUB and the PCB 300, the fourth column sub-pad terminals ROW_PAD_D may be excessively pressed as compared with the third column sub-pad terminals ROW_PAD_C. In this case, the bonding characteristics, such as the area, the thickness, and the resistance of the fourth column sub-pad terminals ROW_PAD_D may cause differences in the bonding characteristics of the third column sub-pad terminals ROW_PAD_D. This may cause inaccurate signal transmission to the display substrate SUB from the PCB 300.

According to one or more exemplary embodiments, given that the third column sub-pad terminals ROW_PAD_C1_CT, ROW_PAD_C3_CT, ROW_PAD_C5_CT, and ROW_PAD_C7_CT of the via structure and the third column sub-pad terminals ROW_PAD_C2_NCT, ROW_PAD_C4_NCT, ROW_PAD_C6_NCT, and ROW_PAD_C8_NCT of the non-via structure are alternately arranged one-by-one along one column of one direction, and the fourth column sub-pad terminals ROW_PAD_D2_CT, ROW_PAD_D4_CT, ROW_PAD_D6_CT, and ROW_PAD_D8_CT of the via structure and the fourth column sub-pad terminals ROW_PAD_D1_NCT, ROW_PAD_D3_NCT, ROW_PAD_D5_NCT, and ROW_PAD_D7_NCT of the non-via structure are alternately arranged one-by-one along another column of one direction, a test terminal need not be separately used. In this manner, a probe may be placed directly in contact with the second pad terminals PAD_TL_B of the PCB 300, thereby enabling performance of a test of the PCB 300.

A method of contacting a probe with the second pad terminals PAD_TL_B of the PCB 300 to perform a test of the PCB 300 will be described with reference to FIG. 7.

Figure 7:
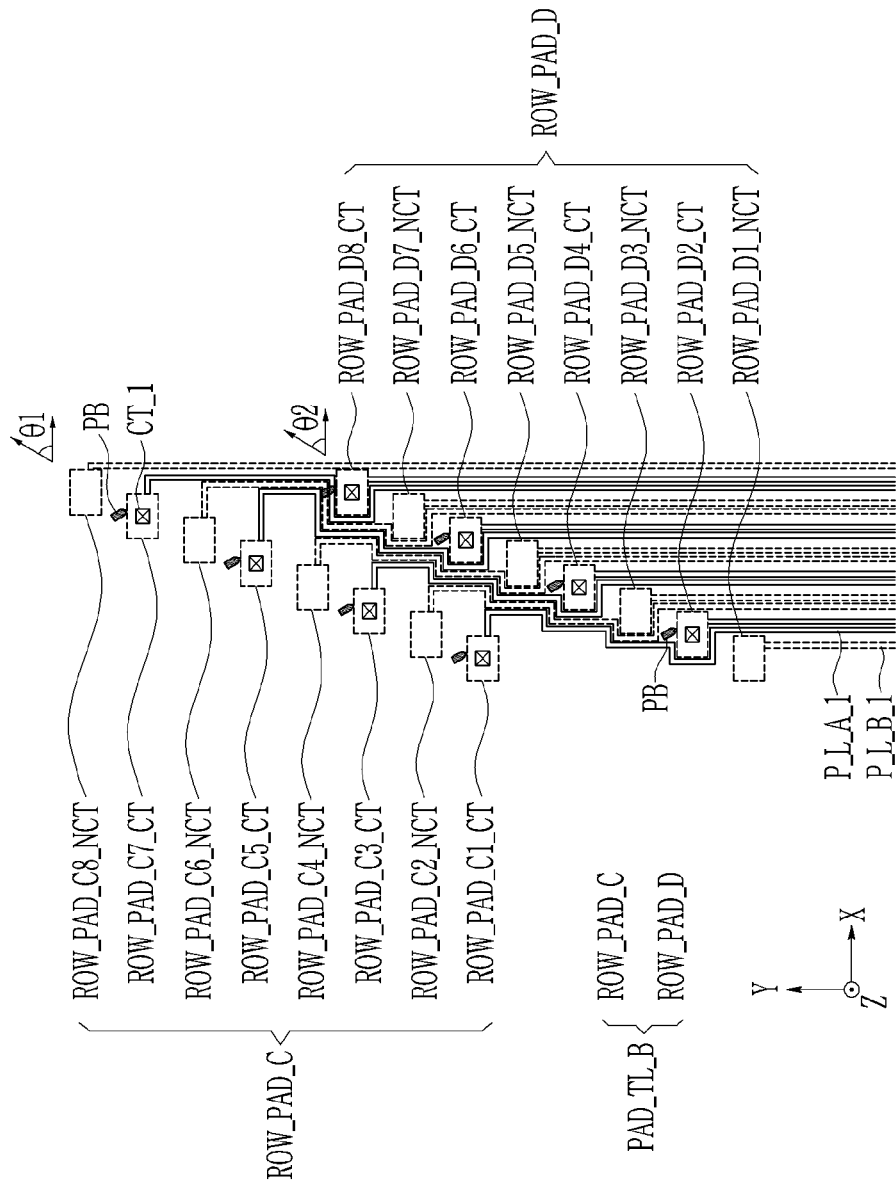
FIG. 7 is a view showing a state in which a probe is in contact with second pad terminals of the printed circuit board of FIG. 5 according to one or more exemplary embodiments.

FIG. 7 is a view showing a state in which a probe is in contact with second pad terminals of the printed circuit board of FIG. 5 according to one or more exemplary embodiments.

Referring to FIG. 7, before bonding the PCB 300 to the display substrate SUB, a test of the PCB 300 may be performed using a probe PB. The test of the PCB 300 may be performed by directly contacting the probe PB with the third column sub-pad terminals ROW_PAD_C1_CT, ROW_PAD_C3_CT, ROW_PAD_C5_CT, and ROW_PAD_C7_CT of the via structure and the fourth column sub-pad terminals ROW_PAD_D2_CT, ROW_PAD_D4_CT, ROW_PAD_D6_CT, and ROW_PAD_D8_CT of the via structure.

As the third column sub-pad terminals ROW_PAD_C1_CT, ROW_PAD_C3_CT, ROW_PAD_C5_CT, and ROW_PAD_C7_CT of the via structure are arranged to be separated from each other via the third column sub-pad terminals ROW_PAD_C2_NCT, ROW_PAD_C4_NCT, ROW_PAD_C6_NCT, and ROW_PAD_C8_NCT of one non-via structure, a test pitch capable of performing the test by directly contacting the probe PB with the third column sub-pad terminals ROW_PAD_C1_CT, ROW_PAD_C3_CT, ROW_PAD_C5_CT, and ROW_PAD_C7_CT of the via structure may be obtained.

For example, to perform the test of the PCB 300, a minimum interval between adjacent probes PB may be about 145 μm. In this case, since each width of the third sub-pad terminals ROW_PAD_C is 70 μm and the third sub-pad terminals ROW_PAD_C are separated in the second direction Y with the interval of 20 μm, a test pitch of 180 μm may be obtained between the third column sub-pad terminals ROW_PAD_C1_CT, ROW_PAD_C3_CT, ROW_PAD_C5_CT, and ROW_PAD_C7_CT of the via structure. That is, the test pitch capable of performing the test by directly contacting the probe PB with the third column sub-pad terminals ROW_PAD_C1_CT, ROW_PAD_C3_CT, ROW_PAD_C5_CT, and ROW_PAD_C7_CT of the via structure may be satisfied. Likewise, in the fourth column sub-pad terminals ROW_PAD_D2_CT, ROW_PAD_D4_CT, ROW_PAD_D6_CT, and ROW_PAD_D8_CT of the via structure, the test pitch capable of performing the test by directly contacting the probe PB may also be satisfied.

As described above, a test of the PCB 300 may be performed by directly contacting a probe PB with the third column sub-pad terminals ROW_PAD_C1_CT, ROW_PAD_C3_CT, ROW_PAD_C5_CT, and ROW_PAD_C7_CT of the via structure and the fourth column sub-pad terminals ROW_PAD_D2_CT, ROW_PAD_D4_CT, ROW_PAD_D6_CT, and ROW_PAD_D8_CT of the via structure. Accordingly, a test terminal and test wires, etc., may be omitted to perform the test of the PCB 300. Since the test terminal and the test wires, etc., may be omitted, a space for the test terminal, the test wires, etc., need not be included when manufacturing the PCB 300. As such, a smaller base film 310 may be used such that the manufacturing cost of the PCB 300 may be reduced.

Additional exemplary embodiments of the second pad terminals PAD_TL_B will be described with reference to FIGS. 8 to 10. Differences from the second pad terminals PAD_TL_B described in FIG. 5 are mainly described. Except for the differences, the characteristics of exemplary embodiments described with reference to FIG. 5 may be applied to exemplary embodiments described with reference to FIGS. 8 to 10 such that the description of the characteristics of the exemplary embodiments described in FIG. 5 are omitted to avoid obscuring exemplary embodiments.

Figure 8:
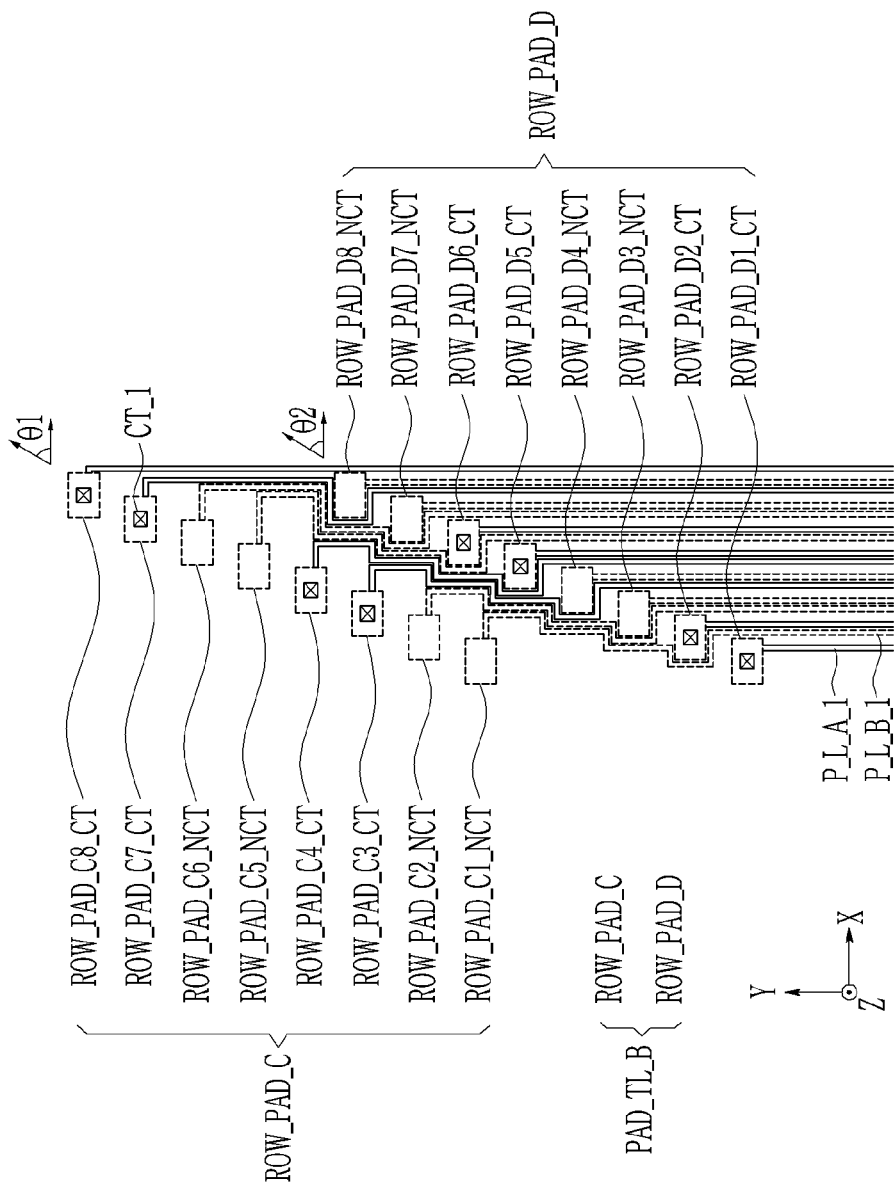
FIG. 8 is a view of second pad terminals of the printed circuit board of FIG. 5 according to one or more exemplary embodiments.

FIG. 8 is a view of second pad terminals of the printed circuit board of FIG. 5 according to one or more exemplary embodiments.

Referring to FIG. 8, the third column sub-pad terminals ROW_PAD_C3_CT, ROW_PAD_C4_CT, ROW_PAD_C7_CT, and ROW_PAD_C8_CT of the via structure and the third column sub-pad terminals ROW_PAD_C1_NCT, ROW_PAD_C2_NCT, ROW_PAD_C5_NCT, and ROW_PAD_C6_NCT of the non-via structure may be alternately arranged two-by-two along one column of one direction. Also, the fourth column sub-pad terminals ROW_PAD_D1_CT, ROW_PAD_D2_CT, ROW_PAD_D5_CT, and ROW_PAD_D6_CT of the via structure and the fourth column sub-pad terminals PAD_D3_NCT, ROW_PAD_D4_NCT, ROW_PAD_D7_NCT and PAD_D8_NCT of the non-via structure may be alternately arranged two-by-two along another column of one direction.

For example, each of the third-third column sub-pad terminal ROW_PAD_C3_CT, the fourth-third column sub-pad terminal ROW_PAD_C4_CT, the seventh-third column sub-pad terminal ROW_PAD_C7_CT, and the eighth-third column sub-pad terminal ROW_PAD_C8_CT may be electrically connected to the first terminal wires P_L_A_1 through the first contact holes CT_1. Also, the first-third column sub-pad terminal ROW_PAD_C1_NCT, the second-third column sub-pad terminal ROW_PAD_C2_NCT, the fifth-third column sub-pad terminal ROW_PAD_C5_NCT, and the sixth-third column sub-pad terminal ROW_PAD_C6_NC may be directly and electrically connected to the second terminal wires P_L_B_1 without the first contact holes CT_1. In addition, each of the first-fourth column sub-pad terminal ROW_PAD_D1_CT, the second-fourth column sub-pad terminal ROW_PAD_D2_CT, the fifth-fourth column sub-pad terminal ROW_PAD_D5_CT, and the sixth-fourth column sub-pad terminal ROW_PAD_D6_CT may be electrically connected to the first terminal wires P_L_A_1 through the first contact holes CT_1. Further, each of the third-fourth column sub-pad terminal ROW_PAD_D3_NCT, the fourth-fourth column sub-pad terminal ROW_PAD_D4_NCT, the seventh-fourth column sub-pad terminal ROW_PAD_D7_NCT, and the eighth-fourth column sub-pad terminal ROW_PAD_D8_NCT may be directly and electrically connected to the second terminal wires P_L_B_1 without the first contact holes CT_1.

In this case, each of the fourth column sub-pad terminals ROW_PAD_D3_NCT, ROW_PAD_D4_NCT, ROW_PAD_D7_NCT, and ROW_PAD_D8_NCT of the non-via structure may be positioned from each of the third column sub-pad terminals ROW_PAD_C3_CT, ROW_PAD_C4_CT, ROW_PAD_C7_CT, and ROW_PAD_C8_CT of the via structure in the second direction Y. Further, each of the fourth column sub-pad terminals ROW_PAD_D1_CT, ROW_PAD_D2_CT, ROW_PAD_D5_CT, and ROW_PAD_D6_CT of the via structure may be positioned from each of the third column sub-pad terminals ROW_PAD_C1_NCT, ROW_PAD_C2_NCT, ROW_PAD_C5_NCT, and ROW_PAD_C5_NCT of the non-via structure in the second direction Y.

Figure 9:
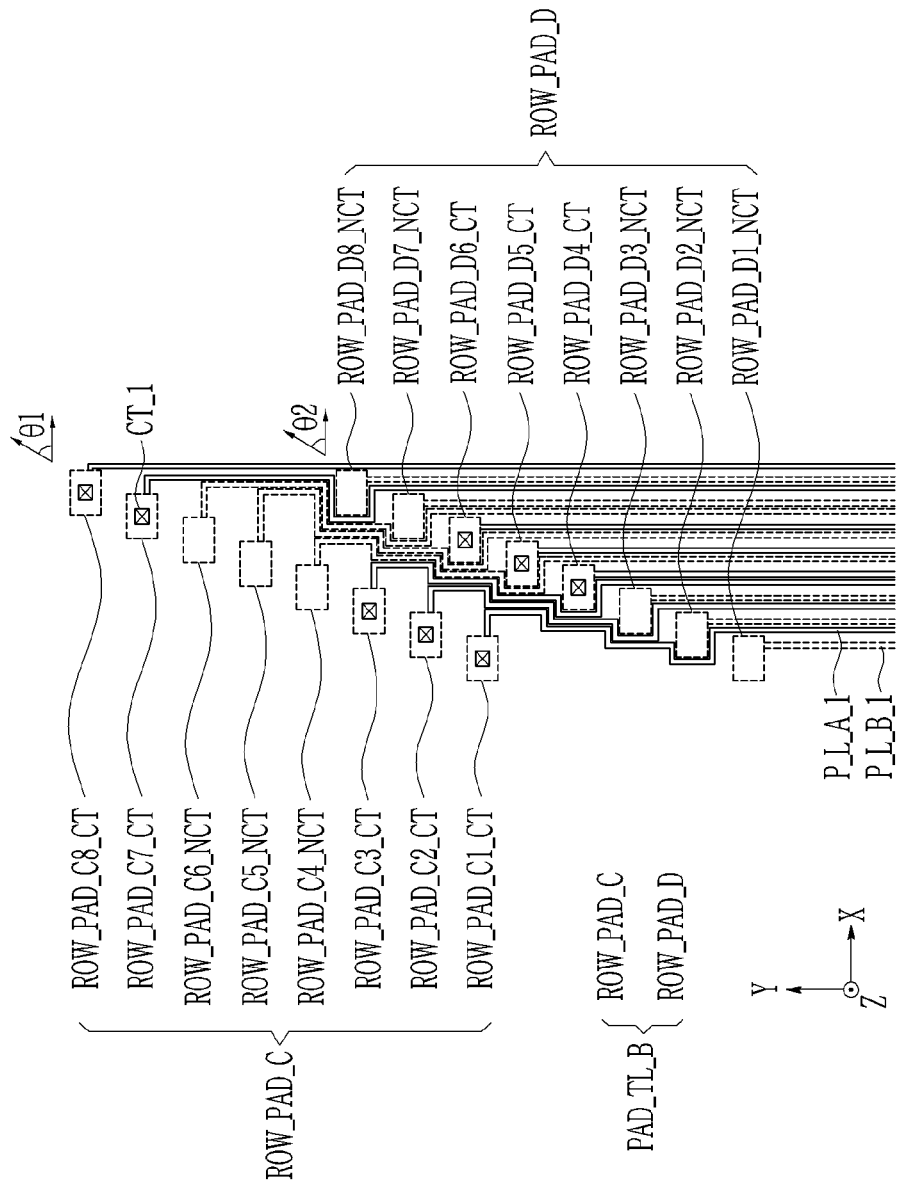
FIG. 9 is a view of second pad terminals of the printed circuit board of FIG. 5 according to one or more exemplary embodiments.

FIG. 9 is a view of second pad terminals of the printed circuit board of FIG. 5 according to one or more exemplary embodiments.

Referring to FIG. 9, the third column sub-pad terminals ROW_PAD_C1_CT, ROW_PAD_C2_CT, ROW_PAD_C3_CT, ROW_PAD_C7_CT, and ROW_PAD_C8_CT of the via structure and the third column sub-pad terminals ROW_PAD_C4_NCT, ROW_PAD_C5_NCT, and ROW_PAD_C6_NCT of the non-via structure may be alternately arranged three-by-three along one column of one direction. Further, the fourth column sub-pad terminals ROW_PAD_D4_CT, ROW_PAD_D5_CT, and ROW_PAD_D6_CT of the via structure and the fourth column sub-pad terminals ROW_PAD_D1_NCT, ROW_PAD_D2_NCT, ROW_PAD_D3_NCT, ROW_PAD_D7_NCT, and ROW_PAD_D8_NCT of the non-via structure may be alternately arranged three-by-three along one column of one direction.

For example, each of the first-third column sub-pad terminal ROW_PAD_C1_CT, the second-third column sub-pad terminal ROW_PAD_C2_CT, the third-third column sub-pad terminal ROW_PAD_C3_CT, seventh-third column sub-pad terminal ROW_PAD_C7_CT, and the eighth-third column sub-pad terminal ROW_PAD_C8_CT may be electrically connected to the first terminal wires P_L_A_1 through the first contact holes CT_1. In addition, each of the fourth-third column sub-pad terminal ROW_PAD_C4_NCT, the fifth-third column sub-pad terminal ROW_PAD_C5_NCT, and the sixth-third column sub-pad terminal ROW_PAD_C6_NCT may be directly and electrically connected to the second terminal wires P_L_B_1 without the first contact holes CT_1. Further, each of the fourth-fourth column sub-pad terminal ROW_PAD_D4_CT, the fifth-fourth column sub-pad terminal ROW_PAD_D5_CT, and the sixth-fourth column sub-pad terminal ROW_PAD_D6_CT may be electrically connected to the first terminal wires P_L_A_1 through the first contact holes CT_1. Also, each of the first-fourth column sub-pad terminal ROW_PAD_D1_NCT, the second-fourth column sub-pad terminal ROW_PAD_D2_NCT, the third-fourth column sub-pad terminal ROW_PAD_D3_NCT, the seventh-fourth column sub-pad terminal ROW_PAD_D7_NCT, and the eighth-fourth column sub-pad terminal ROW_PAD_D8_NCT may be directly and electrically connected to the second terminal wires P_L_B_1 without the first contact holes CT_1.

In this case, each of the fourth column sub-pad terminals ROW_PAD_D1_NCT, ROW_PAD_D2_NCT, ROW_PAD_D3_NCT, ROW_PAD_D7_NCT, and ROW_PAD_D8_NCT of the non-via structure may be positioned from each of the third column sub-pad terminals ROW_PAD_C1_CT, ROW_PAD_C2_CT, ROW_PAD_C3_CT, ROW_PAD_C7_CT, and ROW_PAD_C8_CT of the via structure in the second direction Y. Additionally, each of the fourth column sub-pad terminals ROW_PAD_D4_CT, ROW_PAD_D5_CT, and ROW_PAD_D6_CT of the via structure may be positioned from each of the third column sub-pad terminals ROW_PAD_C4_NCT, ROW_PAD_C5_NCT, and ROW_PAD_C6_NCT of the non-via structure in the second direction Y.

Figure 10:
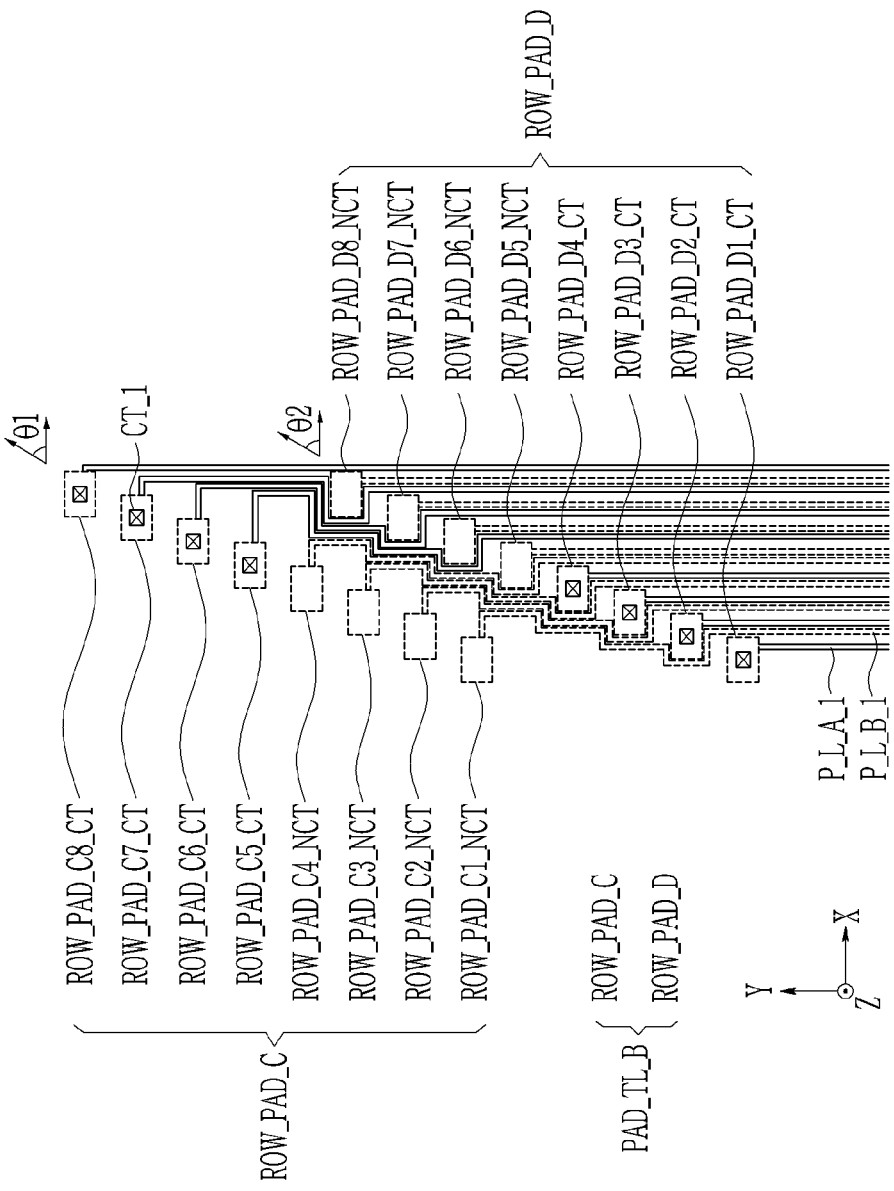
FIG. 10 is a view of second pad terminals of the printed circuit board of FIG. 5 according to one or more exemplary embodiments.

FIG. 10 is a view of second pad terminals of the printed circuit board of FIG. 5 according to one or more exemplary embodiments.

Referring to FIG. 10, the third column sub-pad terminals ROW_PAD_C5_CT, ROW_PAD_C6_CT, ROW_PAD_C7_CT, and ROW_PAD_C8_CT of the via structure and the third column sub-pad terminals ROW_PAD_C1_NCT, ROW_PAD_C2_NCT, ROW_PAD_C3_NCT, and ROW_PAD_C4_NCT of the non-via structure may be alternately arranged four-by-four along one column of one direction. The fourth column sub-pad terminals ROW_PAD_D1_CT, ROW_PAD_D2_CT, ROW_PAD_D3_CT, and ROW_PAD_D4_CT of the via structure and the fourth column sub-pad terminals ROW_PAD_D5_NCT, ROW_PAD_D6_NCT, ROW_PAD_D7_NCT, and ROW_PAD_D8_NCT of the non-via structure may be alternately arranged four-by-four along another column of one direction.

Among the third column sub-pad terminals ROW_PAD_C, the third column sub-pad terminals ROW_PAD_C5_CT, ROW_PAD_C6_CT, ROW_PAD_C7_CT, and ROW_PAD_C8_CT of the via structure may be arranged along one column of one direction at a portion further away from the driving chip 350 than the third column sub-pad terminals ROW_PAD_C1_NCT, ROW_PAD_C2_NCT, ROW_PAD_C3_NCT, and ROW_PAD_C4_NCT of the non-via structure. In addition, among the fourth column sub-pad terminals ROW_PAD_D, the fourth column sub-pad terminals ROW_PAD_D1_CT, ROW_PAD_D2_CT, ROW_PAD_D3_CT, ROW_PAD_D4_CT of the via structure may be arranged along another column of one direction at a portion closer to the driving chip 350 than the fourth column sub-pad terminals ROW_PAD_D5_NCT, ROW_PAD_D6_NCT, ROW_PAD_D7_NCT, and ROW_PAD_D8_NCT of the non-via structure.

Each of the fifth-third column sub-pad terminal ROW_PAD_C5_CT, the sixth-third column sub-pad terminal ROW_PAD_C6_CT, the seventh-third column sub-pad terminal ROW_PAD_C7_CT, and the eighth-third column sub-pad terminal ROW_PAD_C8_CT may be electrically connected to the first terminal wires P_L_A_1 through the first contact holes CT_1. Each of the first-third column sub-pad terminal ROW_PAD_C1_NCT, the second-third column sub-pad terminal ROW_PAD_C2_NCT, the third-third column sub-pad terminal ROW_PAD_C3_NCT, and the fourth-third column sub-pad terminal ROW_PAD_C4_NCT may be directly and electrically connected to the second terminal wires P_L_B_1 without the first contact holes CT_1. Each of the first-fourth column sub-pad terminal ROW_PAD_D1_CT, the second-fourth column sub-pad terminal ROW_PAD_D2_CT, the third-fourth column sub-pad terminal ROW_PAD_D3_CT, and the fourth-fourth column sub-pad terminal ROW_PAD_D4_CT may be electrically connected to the first terminal wires P_L_A_1 through the first contact holes CT_1. Each of the fifth-fourth column sub-pad terminal ROW_PAD_D5_NCT, the sixth-fourth column sub-pad terminal ROW_PAD_D6_NCT, the seventh-fourth column sub-pad terminal ROW_PAD_D7_NCT, and the eighth-fourth column sub-pad terminal ROW_PAD_D8_NCT may be directly and electrically connected to the second terminal wires P_L_B_1 without the first contact holes CT_1.

In this case, each of the fourth column sub-pad terminals ROW_PAD_D5_NCT, ROW_PAD_D6_NCT, ROW_PAD_D7_NCT, and ROW_PAD_D8_NCT of the non-via structure may be positioned from each of the third column sub-pad terminals ROW_PAD_C5_CT, ROW_PAD_C6_CT, ROW_PAD_C7_CT, and ROW_PAD_C8_CT of the via structure in the second direction Y. Each of the fourth column sub-pad terminals ROW_PAD_D1_CT, ROW_PAD_D2_CT, ROW_PAD_D3_CT, and ROW_PAD_D4_CT of the via structure may be positioned from each of the third column sub-pad terminals ROW_PAD_C1_NCT, ROW_PAD_C2_NCT, ROW_PAD_C3_NCT, and ROW_PAD_C4_NCT of the non-via structure in the second direction Y.

As shown in FIGS. 8 to 10, the third column sub-pad terminals ROW_PAD_C and the fourth column sub-pad terminals ROW_PAD_D may be arranged with the via structures and the non-via structures being mixed in different manners. In each case, however, the differences caused in bonding characteristic due to the non-uniformity of the press force depending on the positions of the sub-pad terminals may be reduced in the bonding of the display substrate SUB and the PCB 300.

A state in which the first pad terminals PAD_TL_A and the second pad terminals PAD_TL_B are bonded to each other will be described with reference to FIG. 11.

Figure 11:
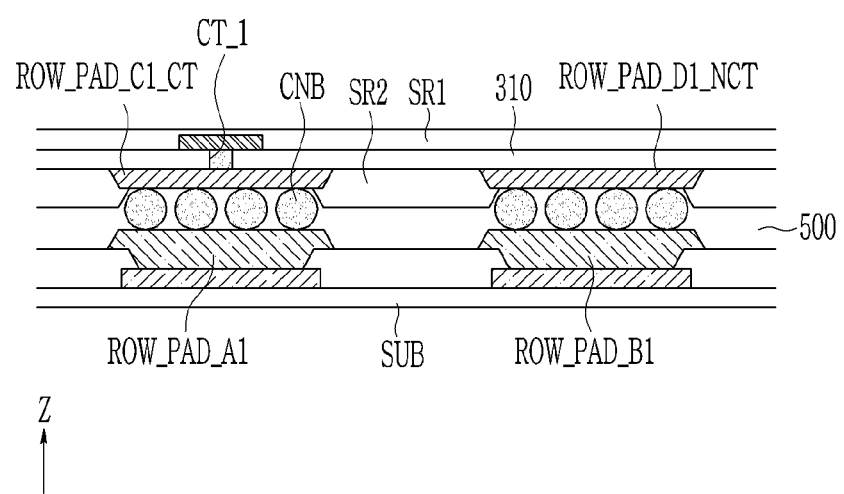
FIG. 11 is a cross-sectional view of a bonding state of a first pad terminal of a display substrate and a second pad terminal of a printed circuit board according to one or more exemplary embodiments.

FIG. 11 is a cross-sectional view of a bonding state of a first pad terminal of a display substrate and a second pad terminal of a printed circuit board according to one or more exemplary embodiments.

Referring to FIG. 11, a state in which the first-third column sub-pad terminal ROW_PAD_C1_CT of the via structure of the PCB 300 of FIG. 5 and the first-fourth column sub-pad terminal ROW_PAD_D1_NCT of the non-via structure of the PCB of FIG. 5 are respectively bonded to the first-first column sub-pad terminal ROW_PAD_A1 of the display substrate SUB and the first-second column sub-pad terminal ROW_PAD_B1 is described as an example.

A conductive adhesion film 500 may be positioned between the first pad terminals PAD_TL_A and the second pad terminals PAD_TL_B. A plurality of conductive balls CNB are included in the conductive adhesion film 500. The conductive balls CNB enable the first column sub-pad terminals ROW_PAD_A and the third column sub-pad terminals ROW_PAD_C to be electrically connected to each other, and the second column sub-pad terminals ROW_PAD_B and the fourth column sub-pad terminals ROW_PAD_D to be electrically connected to each other. As an example, as shown in FIG. 11, the first-third column sub-pad terminal ROW_PAD_C1_CT of the via structure may be electrically connected to the first-first column sub-pad terminal ROW_PAD_A1 through the conductive balls CNB of the conductive adhesion film 500. Further, the first-fourth column sub-pad terminal ROW_PAD_D1_NCT of the non-via structure may be electrically connected to the first-second column sub-pad terminal ROW_PAD_B1 through the conductive balls CNB of the conductive adhesion film 500.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
   a display substrate comprising:
      a display area to display an image; and
      a pad area outside the display area; and
   a printed circuit board (PCB) bonded to a surface of the display substrate in the pad area, wherein the PCB comprises:
      a base film;
      first terminal wires positioned at a first surface of the base film;
      second terminal wires positioned at a second surface of the base film, the second surface opposing the first surface;
      first sub-pad terminals electrically connected to the first terminal wires through contact holes formed in the base film; and
      second sub-pad terminals directly and electrically connected to the second terminal wires without contact holes,
   wherein, in a view normal to the first surface, the first terminal wires and the second terminal wires are spaced apart from one another in a first direction, and
   wherein, in the view normal to the first surface, at least two of the first sub-pad terminals and at least two of the second sub-pad terminals are alternately arranged in a line to form an inclination angle with the first direction.

2. The display device of claim 1, wherein:
   first-first sub-pad terminals of the first sub-pad terminals and first-second sub-pad terminals of the second sub-pad terminals are arranged into a first column; and
   second-first sub-pad terminals of the first sub-pad terminals and second-second sub-pad terminals of the second sub-pad terminals are arranged into a second column.

3. The display device of claim 2, wherein, in the view normal to the first surface:
   the first column forms a first inclination angle with the first direction; and
   the second column forms a second inclination angle with the first direction.

4. The display device of claim 3, wherein the first inclination angle and the second inclination angle are equal to one another.

5. The display device of claim 3, wherein:
   the first-first sub-pad terminals and the first-second sub-pad terminals are alternately arranged one-by-one along the first column; and
   the second-first sub-pad terminals and the second-second sub-pad terminals are alternately arranged one-by-one along the second column.

6. The display device of claim 5, wherein, in the view normal to the first surface, each of the second-second sub-pad terminals is positioned in a second direction with respect to a corresponding first-first sub-pad terminal of the first-first sub-pad terminals, the second direction crossing the first direction.

7. The display device of claim 6, wherein, in the view normal to the first surface, each of the second-first sub-pad terminals is positioned in the second direction with respect to a corresponding first-second sub-pad terminal of the first-second sub-pad terminals.

8. The display device of claim 7, wherein a test pitch between the first-first sub-pad terminals is greater than an interval required between probes to test the PCB.

9. The display device of claim 8, wherein a test pitch between the second-first sub-pad terminals is greater than the interval required between the probes.

10. The display device of claim 3, wherein:
    the first-first sub-pad terminals and the first-second sub-pad terminals are alternately arranged two-by-two along the first column; and
    the second-first sub-pad terminals and the second-second sub-pad terminals are alternately arranged two-by-two along the second column.

11. The display device of claim 10, wherein, in the view normal to the first surface, each of the second-second sub-pad terminals is positioned in a second direction with respect to a corresponding first-first sub-pad terminal of the first-first sub-pad terminals, the second direction crossing the first direction.

12. The display device of claim 11, wherein, in the view normal to the first surface, each of the second-first sub-pad terminals is positioned in a second direction with respect to a corresponding first-second sub-pad terminal of the first-second sub-pad terminals, the second direction crossing the first direction.

13. The display device of claim 3, wherein:
the PCB further comprises a driving chip on the base film; and
the first terminal wires and the second terminal wires are connected to the driving chip.

14. The display device of claim 13, wherein the first terminal wires and the second terminal wires extend from the driving chip in a second direction crossing the first direction.

15. The display device of claim 14, wherein, in the view normal to the first surface, the first terminal wires and the second terminal wires that are connected to the second-first sub-pad terminals and the second-second sub-pad terminals extend in the second direction without a bend.

16. The display device of claim 15, wherein, in the view normal to the first surface, the first terminal wires and the second terminal wires that are connected to the first-first sub-pad terminals and the first-second sub-pad terminals have a shape that is bent at least one time.

17. The display device of claim 13, wherein the first-first sub-pad terminals are positioned further away from the driving chip than the first-second sub-pad terminals.

18. The display device of claim 17, wherein the second-first sub-pad terminals are positioned closer to the driving chip than the second-second sub-pad terminals.

19. A display device comprising:
a display substrate comprising:
a display area to display an image; and
a pad area outside the display area; and
a printed circuit board (PCB) bonded to a surface of the display substrate in the pad area, wherein the PCB comprises:
a base film;
first terminal wires positioned at a first surface of the base film;
second terminal wires positioned at the base film;
first sub-pad terminals electrically connected to the first terminal wires through contact holes formed in the base film; and
second sub-pad terminals directly and electrically connected to the second terminal wires without contact holes, and
wherein, in a view normal to the first surface, the first terminal wires and the second terminal wires are spaced apart from one another in a first direction, first ones of the first sub-pad terminals are alternately arranged with first ones of the second sub-pad terminals in a first line to form a first column extending in a second direction crossing the first direction, the first column comprising at least two of the first sub-pad terminals and at least two of the second sub-pad terminals, and
wherein, in the view normal to the first surface, second ones of the first sub-pad terminals are alternately arranged with second ones of the second sub-pad terminals in a second line to form a second column extending in the second direction and spaced apart from the first column in the first direction, the second column comprising at least two of the first sub-pad terminals and at least two of the second sub-pad terminals.

20. The display device of claim 19, wherein at least one of the first ones and the second ones are alternately arranged one-by-one or two-by-two.

* * * * *